United States Patent
Taguchi

(10) Patent No.: US 8,492,071 B2
(45) Date of Patent: Jul. 23, 2013

(54) CURABLE COMPOSITION, COLOR FILTER AND PROCESS FOR PRODUCTION THEREOF, AND SOLID-STATE IMAGING DEVICE

(75) Inventor: Hiroshi Taguchi, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 65 days.

(21) Appl. No.: 12/935,535

(22) PCT Filed: Mar. 27, 2009

(86) PCT No.: PCT/JP2009/056287
§ 371 (c)(1),
(2), (4) Date: Sep. 29, 2010

(87) PCT Pub. No.: WO2009/123050
PCT Pub. Date: Oct. 8, 2009

(65) Prior Publication Data
US 2011/0028587 A1    Feb. 3, 2011

(30) Foreign Application Priority Data
Mar. 31, 2008   (JP) ................................. 2008-093395

(51) Int. Cl.
G03C 1/00 (2006.01)
G03C 1/04 (2006.01)
G03C 1/053 (2006.01)
G03C 1/73 (2006.01)
C08F 2/50 (2006.01)

(52) U.S. Cl.
USPC ...... 430/281.1; 430/7; 430/270.1; 430/273.1; 430/285.1; 430/286.1; 430/287.1; 430/288.1; 430/320; 522/25; 522/28; 522/30; 522/33; 522/36; 522/39; 522/40; 522/43; 522/44; 522/46; 522/47; 522/48; 522/49; 522/63; 522/65; 522/113; 522/114; 522/116; 522/120; 522/121; 522/150; 522/153; 522/154; 522/178; 522/181; 522/182; 522/148; 522/75; 522/74; 522/81

(58) Field of Classification Search
USPC ................. 522/26, 28, 30, 33, 36, 39, 40, 43, 522/44, 46, 47, 48, 49, 63, 65, 113, 114, 522/116, 120, 121, 150, 153, 154, 178, 181, 522/182, 99, 148, 74, 75, 81; 430/270.1, 430/273.1, 281.1, 286.1, 287.1, 288.1, 320, 430/7
See application file for complete search history.

(56) References Cited

U.S. PATENT DOCUMENTS

| | | | |
|---|---|---|---|
| 5,806,834 A | 9/1998 | Yoshida | |
| 2007/0238047 A1* | 10/2007 | Hsu et al. | 430/270.1 |
| 2010/0323285 A1* | 12/2010 | Einaga | 430/7 |
| 2011/0039195 A1* | 2/2011 | Einaga | 430/7 |

FOREIGN PATENT DOCUMENTS

| | | | |
|---|---|---|---|
| JP | 2-127602 A | | 5/1990 |
| JP | 8-239509 A | | 9/1996 |
| JP | 9-043844 A | | 2/1997 |
| JP | 11-38226 A | | 2/1999 |
| JP | 2874091 B2 | | 3/1999 |
| JP | 2000-35670 A | | 2/2000 |
| JP | 2004-020917 A | | 1/2004 |
| JP | 2006-30541 A | | 2/2006 |
| JP | 2007-034119 A | | 2/2007 |
| JP | 2007034119 A | * | 2/2007 |
| JP | 2007-65640 A | | 3/2007 |
| JP | 2007279720 A | * | 10/2007 |
| JP | 2008-34509 A | | 2/2008 |
| KR | 10-2007-0016975 A | | 2/2007 |
| WO | 2006/035807 A1 | | 4/2006 |

OTHER PUBLICATIONS

IRGACURE 369 product sheet from Ciba-Geigy Corp. in Photoinitiator for Ultraviolet Curing of Inks, Pigmented Coatings and Thick Section Coating. (1993). [online]. [Retrieved online on Mar. 7, 2012]. Retrived from Internet: <URL:http://www.tri-iso.com/SiteAdmin/Portals/0/12_221_Irgacure%20369.pdf>.*
Communication, dated Dec. 14, 2011, issued in corresponding EP Application No. 09727716.4, 9 pages.
Office Action dated Mar. 18, 2013 on Korean Patent Application No. 2010-7023863.

* cited by examiner

Primary Examiner — Sanza McClendon
(74) Attorney, Agent, or Firm — Sughrue Mion, PLLC

(57) ABSTRACT

A curable composition containing (A) a polymerizable compound having an alkyleneoxy group having two or more carbon atoms, (B) a polymerizable compound lacking an alkyleneoxy group having two or more carbon atoms, (C) an i-line absorber, (D) a photopolymerization initiator, (E) an alkali-soluble resin, and (F) a pigment, wherein a mass ratio [(A)/((A)+(B))] is from 0.5 to 0.9, and an i-line transmittance obtainable when the curable composition is formed into a coating film having a thickness of 0.7 μm, is 10% or less. The curable composition of the invention has enhanced adhesiveness upon forming a micro pattern, and can reduce development residues in unexposed non-cured areas. The curable composition of the invention is suitable for the use in color filters.

11 Claims, No Drawings

CURABLE COMPOSITION, COLOR FILTER AND PROCESS FOR PRODUCTION THEREOF, AND SOLID-STATE IMAGING DEVICE

TECHNICAL FIELD

The present invention relates to a curable composition, a color filter and a method for producing the color filter, and a solid-state imaging device.

BACKGROUND ART

A color filter is an essential constituent component of a liquid crystal display (LCD) or a solid-state imaging device (such as CCD or CMOS).

When compared with a CRT as a display apparatus, a liquid crystal display is compact, and is equivalent or superior in terms of performance. Thus, liquid crystal displays are substituting the traditional CRT's as the display unit of television screens, personal computer screens and other display apparatuses. Recently, the technological trend for liquid crystal displays is shifting from the conventional monitor applications where the screens have relatively small surface areas, toward TV applications where screens are large and high image quality is demanded.

In LCD color filter applications, the size of the substrate is enlarging for the use in large-screen TV's. Thus, for an enhancement of productivity in the case of using large-size substrates, curable compositions that can be cured with low energy are desirable as the curable compositions used for forming colored pixels (that is, color filters) for red (R), green (G), blue (B) and the like.

Furthermore, liquid crystal displays for TV applications are required to have higher image quality as compared with those for conventional monitor applications. That is, an enhancement of contrast and color purity is required. Therefore, in view of enhancing contrast, a curable composition that is used in the formation of a colored pixel (color filter) is required to use a colorant (such as an organic pigment) having a finer particle size (see, for example, Patent Document 1). Accordingly, there is a tendency that the amount of addition of a dispersant for pigment dispersion increases. Furthermore, in view of enhancing color purity, it is required that the content ratio of the colorant (such as an organic pigment) occupying in the solids content of the curable composition be higher. Accordingly, there is a tendency that the content ratios of the photopolymerization initiator and photopolymerizable monomer occupying in the solid components of the curable composition relatively decrease.

On the other hand, in regard to the color filter applications for solid-state imaging devices, reduction of pattern film thickness is in progress, and consequently, the pigment concentration in the curable composition is increasing along. Furthermore, as the pigment particles are becoming finer, the proportion of the pigment dispersant in the curable composition also tends to increase. Therefore, the content ratios of photopolymerization initiators and photopolymerizable monomers are relatively reduced.

As discussed above, for both the liquid crystal display applications and the solid-state imaging device applications, since the content ratios of the photopolymerization initiator and photopolymerizable monomer, which are essential components necessary for curing a curable composition, are limited while the pigment concentration is increasing, the adhesiveness between the curable composition and an inorganic base material that serves as a substrate is insufficient. Furthermore, formation of a desired pattern is becoming markedly difficult.

In this connection, a technology of introducing a silane coupling agent in order to enhance the adhesiveness to an inorganic substrate, has been proposed (see, for example, Patent Documents 3 and 4). There has also been proposed a technology of introducing a primary amine or secondary amine-based silane coupling agent, as a technology for preventing development residues in areas that should be essentially developed and removed (unexposed areas in a negative type) (see, for example, Patent Document 5).

[Patent Document 1] Japanese Patent Application Laid-Open No. 2006-30541
[Patent Document 2] Japanese Patent Application Laid-Open No. 2-127602
[Patent Document 3] Japanese Patent No. 2874091
[Patent Document 4] Japanese Patent Application Laid-Open No. 11-38226
[Patent Document 5] Japanese Patent Application Laid-Open No. 2000-35670

DISCLOSURE OF THE INVENTION

Problems to be Solved by the Invention

In recent years, colored patterns of color filters tend to be formed into thinner layers, and the size of the colored patterns tends to become finer. Particularly, such tendencies are conspicuous in color filters for solid-state imaging devices.

Furthermore, in recent years, concomitantly with an increase in the illuminance of the lamp light source resulting from an increase in the throughput of an exposure apparatus, precision enhancement due to high discrimination is required more than ever before.

Under such circumstances, it is difficult to suppress development residues and to form fine patterns while maintaining the adhesiveness to the base.

The invention was made in the light of the problems described above, and the invention is intended to achieve the following objects.

That is, an object of the invention is to provide a curable composition which is capable of enhancing adhesiveness when a fine pattern is formed, and is capable of reducing development residues in the unexposed non-cured areas.

Another object of the invention is to provide a color filter which has excellent adhesiveness, and has a fine pattern with less development residues.

Still another object of the invention is to provide a solid-state imaging device having less noise and excellent color reproducibility.

Means for Solving the Problem

Specific means for solving the objects described above are as follows.

<1> A curable composition including (A) a polymerizable compound having an alkyleneoxy group having two or more carbon atoms, (B) a polymerizable compound lacking an alkyleneoxy group having two or more carbon atoms, (C) an i-line absorber, (D) a photopolymerization initiator, (E) an alkali-soluble resin, and (F) a pigment, wherein a mass ratio [(A)/((A)+(B))] is from 0.5 to 0.9, and an i-line transmittance obtainable when the curable composition is formed into a coating film having a thickness of 0.7 μm, is 10% or less.

<2> The curable composition of <1>, further including (G) an alkoxysilane compound, wherein the content of the (G)

alkoxysilane compound is from 0.1% by mass to 10.0% by mass relative to total solid content.

<3> The curable composition of <1> or <2>, wherein the (C) i-line absorber contains a diethylamine structure.

<4> The curable composition of any one of <1> to <3>, wherein the (E) alkali-soluble resin contains an ethylenically unsaturated double bond.

<5> The curable composition of any of one of <2> to <4>, wherein the (G) alkoxysilane compound includes an amino group-containing alkoxysilane compound.

<6> A color filter formed by using the curable composition of any one of <1> to <5>.

<7> The color filter of <6>, which is formed directly on an inorganic base material.

<8> The color filter of <6> or <7>, including a colored Bayer array pattern.

<9> A solid-state imaging device including the color filter of any one of <6> to <8>.

Advantageous Effect of the Invention

According to the invention, there may be provided a curable composition which is capable of enhancing adhesiveness when a fine pattern is formed, and is capable of reducing development residues in the unexposed non-cured areas.

According to the invention, there may also be provided a color filter having excellent adhesiveness and having a fine pattern with less development residues, and a method for production thereof.

According to the invention, there may also be provided a solid-state imaging device having less noise and excellent color reproducibility.

BEST MODE FOR CARRYING OUT THE INVENTION

<<Curable Composition>>

The curable composition of the invention contains (A) a polymerizable compound having an alkyleneoxy group having two or more carbon atoms, (B) a polymerizable compound lacking an alkyleneoxy group having two or more carbon atoms, (C) an i-line absorber, (D) a photopolymerization initiator, (E) an alkali-soluble resin, and (F) a pigment, wherein a mass ratio [(A)/((A)+(B))] is from 0.5 to 0.9, and an i-line transmittance obtainable when the curable composition is formed into a coating film having a thickness of 0.7 μm, is 10% or less.

The curable composition of the invention having such a constitution as described above may have enhanced adhesiveness when forming a fine pattern, and may reduce development residues in unexposed non-cured areas. Furthermore, resolving power is also increased.

From the viewpoint of obtaining the effects of the invention more effectively, the fine pattern is preferably a fine pattern having a line width of 2.0 μm or less, and more preferably a fine pattern having a line width of 1.7 μm or less.

The "line width" as used herein means the length in the width direction in the case of a rectangular pattern; the length of one side in the case of a square pattern; the diameter in the case of a circular pattern; and the minor axis in the case of an elliptical pattern.

As described above, since the curable composition of the invention is capable of forming a colored pattern having excellent adhesiveness to a base material (support), the curable composition is particularly suitable in, for example, an application where a colored pattern is directly formed on an inorganic base material without having an undercoat organic film provided therebetween.

Furthermore, since the curable composition of the invention is excellent in adhesiveness and is capable of forming a colored pattern having less development residues, even in the case of exposing using a high illuminance exposure apparatus, the same resolving power as that obtainable in the case of exposing using a low illuminance exposure apparatus, may be obtained.

Therefore, the curable composition is particularly suitable for a high illuminance exposure apparatus giving a lamp light source illuminance of 600 mW/cm$^2$ or greater (more preferably 800 mW/cm$^2$ or greater, and even more preferably 1000 mW/cm$^2$ or greater).

The curable composition of the invention is such that when the composition is formed into a coating film having a thickness of 0.7 μm, the i-line transmittance is 10% or less. The coating film refers to a coating film prior to exposure.

According to the invention, the i-line transmittance refers to a value measured according to the following method.

That is, the curable composition of the invention was applied on plain glass, and the curable composition was subjected to prebaking to form a coating film having a thickness of 0.7 μm. The i-line transmittance of the coating film was measured using MCPD-3000 (trade name, manufactured by Otsuka Electronics Co., Ltd.).

Here, when the i-line transmittance exceeds 10%, the resolving power is decreased.

From the viewpoint of obtaining the effects according to the invention more effectively, the i-line transmittance is preferably 8% or less, and more preferably 6% or less.

According to the invention, it is necessary that the mass ratio [(A)/((A)+(B))] be from 0.5 to 0.9.

If the mass ratio is less than 0.5, the development residues become worse, and the resolving power is decreased. On the other hand, if the mass ratio is greater than 0.9, adhesiveness is deteriorated.

From the viewpoint of obtaining the effects according to the invention more effectively, the mass ratio is preferably from 0.6 to 0.8.

Hereinafter, the various components of the curable composition of the invention will be explained.

<(A) Polymerizable Compound Having Alkyleneoxy Group Having Two or More Carbon Atoms>

The curable composition of the invention contains at least one (A) polymerizable compound having an alkyleneoxy group having two or more carbon atoms (hereinafter, also referred to as "component (A)").

When the composition does not contain such a polymerizable compound (for example, when the composition contains only a polyfunctional polymerizable compound), developability of the non-cured areas is insufficient, so that development residues become worse, and the resolving power is decreased.

The "polymerizable compound having an alkyleneoxy group having two or more carbon atoms" according to the invention is not particularly limited, but for example, the polymerizable compound is preferably at least one selected from the group consisting of compounds represented by the following formula (i) or (ii).

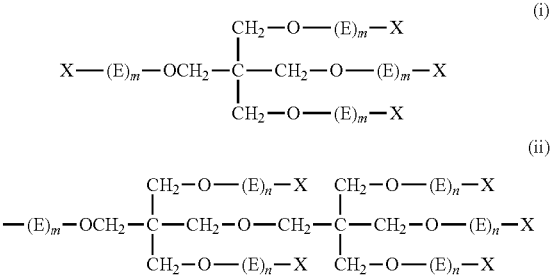

(i)

(ii)

In the formulas (i) and (ii), E's each independently represent —$((CH_2)_yCH_2O)$—, or —$((CH_2)_yCH(CH_3)O)$—; and y's each independently represent an integer from 1 to 10.

In the formulas (i) and (ii), X's each independently represent an acryloyl group, a methacryloyl group, a hydrogen atom or a carboxyl group.

In the formula (i), the sum of acryloyl groups and methacryloyl groups is 3 or 4; and m's each independently represent an integer from 0 to 10, while the sum of respective m's is an integer from 1 to 40.

In the formula (ii), the sum of acryloyl groups and methacryloyl groups is 5 or 6; and n's each independently represent an integer from 0 to 10, while the sum of respective n's is an integer from 1 to 60.

In the formula (i), m is preferably an integer from 0 to 6, and more preferably an integer from 0 to 4. Furthermore, the sum of respective m's is preferably an integer from 2 to 40, more preferably an integer from 2 to 16, and particularly preferably an integer from 4 to 8.

In the formula (ii), n is preferably an integer from 0 to 6, and more preferably an integer from 0 to 4. Furthermore, the sum of respective n's is preferably an integer from 3 to 60, more preferably an integer from 3 to 24, and particularly preferably an integer from 6 to 12.

The group —$((CH_2)_yCH_2O)$— or —$((CH_2)_yCH(CH_3)O)$— in the formula (i) or formula (ii) is preferably in the form in which the terminal on the oxygen atom side is linked to X.

The compounds represented by the formula (i) or (ii) may be synthesized from a step of linking a ring-opened skeleton such as ethylene oxide or propylene oxide to pentaerythritol or dipentaerythritol by a ring-opening addition reaction, and a step of introducing a (meth)acryloyl group to a terminal hydroxyl group of the ring-opened skeleton through, for example, a reaction with (meth)acryloyl chloride, which are conventionally known processes. The respective processes are well known processes, and a person ordinarily skilled in the art will be able to easily synthesize a compound represented by the formula (i) or (ii).

Among the compounds represented by the formulas (i) and (ii), pentaerythritol derivatives and/or dipentaerythritol derivatives are more preferable.

Specifically, there may be mentioned compounds represented by the following formulas (a) to (f) (hereinafter, also referred to as "example compounds (a) to (f)"), and among them, example compounds (a), (b), (e) and (f) are preferred.

(a)

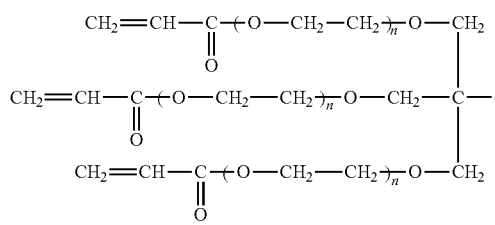 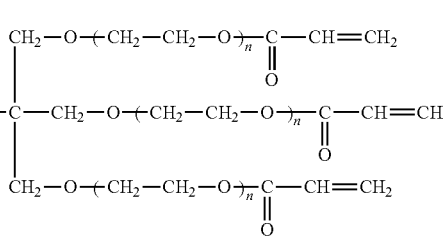

Sum of respective n's is 6

(b)

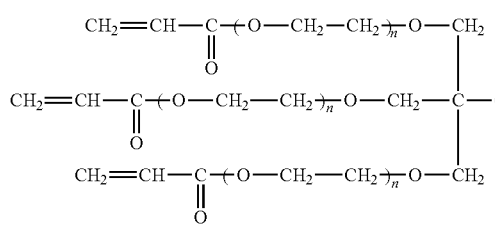 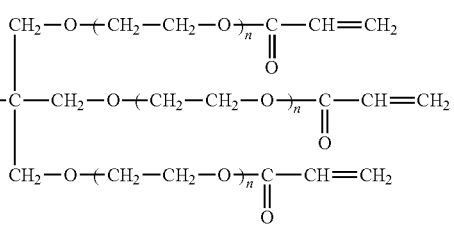

Sum of respective n's is 12

(c)

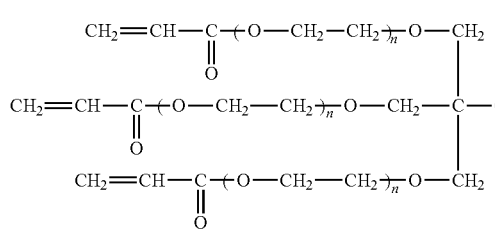 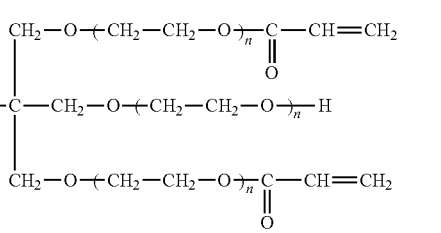

Sum of respective n's is 12

-continued

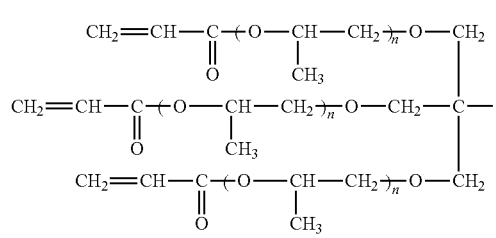
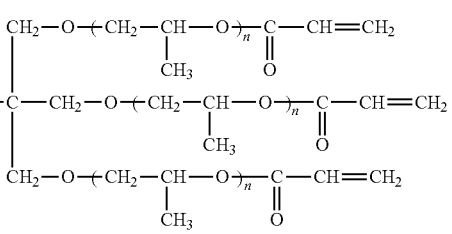

(d)

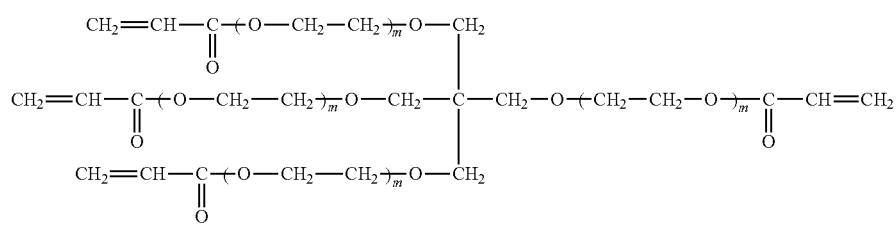

Sum of respective n's is 6

(e)

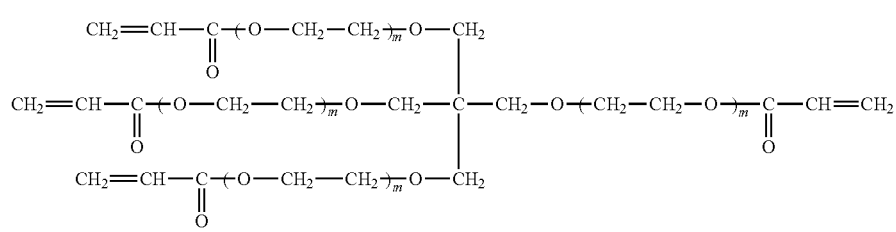

Sum of respective n's is 4

(f)

Sum of respective n's is 12

Examples of commercially available products of the compounds represented by the formula (i) or formula (ii) include SR-494 (trade name, manufactured by Sartomer, LLC), DPCA-60 and TPA-330 (trade names, manufactured by Nippon Kayaku Co., Ltd.).

<(B) Polymerizable Compound Lacking Alkyleneoxy Group Having Two or More Carbon Atoms>

The curable composition of the invention contains at least one (B) polymerizable compound lacking an alkyleneoxy group having two or more carbon atoms (hereinafter, also referred to as "component (B)").

When the composition contains such a polymerizable compound, the occurrence in which the solubility of cured areas in the developer liquid is increased, or the occurrence in which the line width sensitivity is decreased, may be more effectively suppressed.

The polymerizable compound mentioned above is preferably a compound having a polymerizable group (that is, being a "polymerizable compound that has a polymerizable group and does not have an alkyleneoxy group having two or more carbon atoms"). The number of the polymerizable groups is more preferably 2 or more, and particularly preferably 3 or more.

The "polymerizable compound that has a polymerizable group and does not have an alkyleneoxy group having two or more carbon atoms" is not particularly limited, but for example, monofunctional acrylate or methacrylate (for example, polyethylene glycol mono(meth)acrylate, polypropylene glycol mono(meth)acrylate, and phenoxyethyl (meth)acrylate), polyethylene glycol di(meth)acrylate, trimethylolethane tri(meth)acrylate, neopentyl glycol di(meth)acrylate, pentaerythritol tri(meth)acrylate, pentaerythritol tetra(meth)acrylate, dipentaerythritol hexa(meth)acrylate, hexanediol (meth)acrylate, and the like may be used.

Furthermore, as the "polymerizable compound that has a polymerizable group and does not have an alkyleneoxy group having two or more carbon atoms," compounds represented by the following formula (iii) or formula (Iv) may also be suitably used.

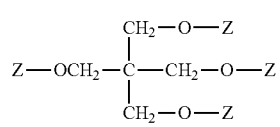

(iii)

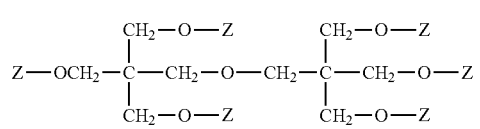

(iv)

In the formulas (iii) and (iv), Z's each independently represent an acryloyl group, a methacryloyl group, a hydrogen atom or a carboxyl group.

In the formula (iii), the sum of acryloyl groups and methacryloyl groups is 3 or 4. Furthermore, in the formula (Iv), the sum of acryloyl groups and methacryloyl groups is 5 or 6.

The component (A) and the component (B) according to the invention may be used together with a known polymerizable compound. Examples of the known polymerizable compound include the following compounds.

That is, monofunctional acrylates or methacrylates (for example, polyethylene glycol mono(meth)acrylate, polypropylene glycol mono(meth)acrylate, and phenoxyethyl (meth) acrylate), and monofunctional acrylate or methacrylate such as polyethylene glycol mono(meth)acrylate, polypropylene glycol mono(meth)acrylate, and phenoxyethyl(meth) acrylate; and polyfunctional acrylates or methacrylates, such as polyethylene glycol di(meth)acrylate, trimethylolethane tri (meth)acrylate, neopentyl glycol di(meth)acrylate, pentaerythritol tri(meth)acrylate, pentaerythritol tetra(meth) acrylate, dipentaerythritol hexa(meth)acrylate, hexanediol (meth)acrylate, trimethylolpropane tri(acryloyloxypropyl) ether, tri(acryloyloxyethyl)isocyanurate, products produced by adding ethylene oxide or propylene oxide to a polyfunctional alcohol such as glycerin or trimethylolethane and then (meth)acrylating the addition product, urethane acrylates described in Japanese Patent Application Publication (JP-B) No. 48-41708, JP-B-50-6034, and JP-A-51-37193, polyester acrylates described in JP-A-48-64183, JP-B-49-43191 and JP-B-52-30490, epoxy acrylates which are reaction products of epoxy resins and (meth)acrylic acid. In addition, those introduced in Journal of the Adhesion Society of Japan, Vol. 20, No. 7, pp. 300-308, as photocurable monomers and oligomers, may also be used.

Thus, the polymerizable compounds according to the invention (component (A) and component (B)) have been explained, but from the viewpoint of obtaining the effects according to the invention more effectively, the total content of the polymerizable compounds including the component (A) and the component (B) is preferably 1 to 50% by mass, more preferably 1 to 40% by mass, and particularly preferably 1 to 30% by mass, relative to total solid content of the curable composition.

<(C) i-Line Absorber>

The curable composition of the invention contains at least one (C) i-line absorber.

The (C) i-line absorber is not particularly limited as long as it is a compound capable of absorbing the i-line of a mercury lamp (wavelength 365 nm), but it is preferably a compound containing a diethylamine structure.

Suitable examples of the (C) i-line absorber include a compound represented by the following formula (1) or a compound represented by the following formula (2).

Hereinafter, these compounds will be explained.

(Compound represented by formula (1))

As the (C) i-line absorber according to the invention, a compound represented by the following formula (1) is suitable.

The compound represented by the following formula (1) is a conjugated diene-based compound. As this conjugated diene-based compound is used, particularly when low illuminance exposure has been implemented, fluctuation in the development performance after the exposure is suppressed, and therefore, the dependency on the exposure illuminance, which is related to pattern forming properties such as the line width of pattern, film thickness and spectroscopic spectrum, may be suppressed.

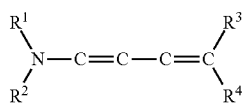

Formula (1)

In the formula (1), $R^1$ and $R^2$ each independently represent a hydrogen atom, an alkyl group having 1 to 20 carbon atoms, or an aryl group having 6 to 20 carbon atoms, and $R^1$ and $R^2$ may be identical to or different from each other, but are not intended to simultaneously represent hydrogen atoms.

Examples of the alkyl group having 1 to 20 carbon atoms, which is represented by $R^1$ and $R^2$, include a methyl group, an ethyl group, a propyl group, an n-butyl group, an n-hexyl group, a cyclohexyl group, an n-decyl group, an n-dodecyl group, an n-octadecyl group, an eicosyl group, a methoxyethyl group, an ethoxypropyl group, a 2-ethylhexyl group, a hydroxyethyl group, a chloropropyl group, an N,N-diethylaminopropyl group, a cyanoethyl group, a phenethyl group, a benzyl group, a p-t-butylphenethyl group, a p-t-octylphenoxyethyl group, a 3-(2,4-di-t-amylphenoxy)propyl group, an ethoxycarbonylmethyl group, a 2-(2-hydroxyethoxy)ethyl group, and a 2-furylethyl group.

The aryl group having 6 to 20 carbon atoms, which is represented by $R^1$ and $R^2$, may be a monocyclic or condensed cyclic ring, and may be any of a substituted aryl group having a substituent, and an unsubstituted aryl group. Examples of the substituent for the substituted aryl group having a substituent include an alkyl group, an aryl group, an alkoxy group, an aryloxy group, an acyloxy group, a halogen atom, an acylamino group, an acyl group, an alkylthio group, an arylthio group, a hydroxyl group, a cyano group, an alkyloxycarbonyl group, an aryloxycarbonyl group, a substituted carbamoyl group, a substituted sulfamoyl group, a nitro group, a substituted amino group, an alkylsulfonyl group, and an arylsulfonyl group. Among them, a phenyl group, a 1-naphthyl group and a 2-naphthyl group, all of which may be substituted or unsubstituted, are preferred.

Furthermore, $R^1$ and $R^2$ may form a cyclic amino group together with a nitrogen atom. Examples of the cyclic amino group include a piperidino group, a morpholino group, a pyrrolidino group, a hexahydroazepino group, and a piperazino group.

Among them, $R^1$ and $R^2$ are each preferably a lower alkyl group having 1 to 8 carbon atoms (for example, methyl, ethyl, isopropyl, butyl, sec-butyl, tert-butyl, pentyl, tert-pentyl, hexyl, octyl, 2-ethylhexyl or tert-octyl), or a substituted or unsubstituted phenyl group (for example, a tolyl group, a phenyl group, an anisyl group, a mesityl group, a chlorophenyl group, or a 2,4-di-t-amylphenyl group). It is also preferable that $R^1$ and $R^2$ be joined to form a ring containing the nitrogen atom represented by N in the formula (for example, a piperidine ring, a pyrrolidine ring, or a morpholine ring).

In the formula (1), $R^3$ and $R^4$ each represent an electron-withdrawing group. Here, the electron-withdrawing group is an electron-withdrawing group having a Hammett's substituent constant, $\sigma_p$ value (hereinafter, simply referred to as "$\sigma_p$ value") of from 0.20 to 1.0. The electron-withdrawing group is preferably an electron-withdrawing group having a $\sigma_p$ value of from 0.30 to 0.8.

Hammett's rule is an empirical rule proposed by L. P. Hammett in 1935 in order to quantitatively analyze the influence of substituents exerted on the reaction or equilibrium of a benzene derivative, and the validity of this rule is widely recognized today. The substituent constant determined by Hammett's rule includes the $\sigma_p$ value and the $\sigma_m$ value, and these values are disclosed in many general textbooks, the details of which are described in, for example, J. A. Dean, Ed., "Lange's Handbook of Chemistry", 12$^{th}$ Edition, 1979 (McGraw-Hill); "Kagaku no Ryoiki (Realms of Chemistry), Special Edition", No. 122, pp. 96-103, 1979 (Nankodo); and Chemical Reviews, Vol. 91, pp. 165-195, 1991. According to the invention, it is not meant that only the values described in these books and already known in the literature are limitedly used for a certain substituent, and even if a value is not known in the literature, the value will be definitely included in the invention as long as the value falls within the known range when measured on the basis of Hammett's rule.

Specific examples of the electron-withdrawing group having a $\sigma_p$ value of from 0.20 to 1.0 include an acyl group, an acyloxy group, a carbamoyl group, an alkyloxycarbonyl group, an aryloxycarbonyl group, a cyano group, a nitro group, a dialkylphosphono group, a diarylphosphono group, a diarylphosphinyl group, an alkylsulfinyl group, an arylsulfinyl group, an alkylsulfonyl group, an arylsulfonyl group, a sulfonyloxy group, an acylthio group, a sulfamoyl group, a thiocyanate group, a thiocarbonyl group, an alkyl group substituted with at least two or more halogen atoms, an alkoxy group substituted with at least two or more halogen atoms, an aryloxy group substituted with at least two or more halogen atoms, an alkylamino group substituted with at least two or more halogen atoms, an alkylthio group substituted with at least two or more halogen atoms, an aryl group substituted with another electron-withdrawing group having a $\sigma_p$ value of 0.20 or greater, a heterocyclic group, a chlorine atom, a bromine atom, an azo group, and a selenocyanate group. Among these substituents, groups capable of being further substituted may further have substituents such as those mentioned above.

Among those described above, according to the invention, $R^3$ is preferably a group selected from a cyano group, —COOR$^5$, —CONHR$^5$, —COR$^5$ and —SO$_2$R$^5$, and $R^4$ is preferably a group selected from a cyano group, —COOR$^6$, —CONHR$^6$, —COR$^6$ and —SO$_2$R$^6$. $R^5$ and $R^6$ each independently represent an alkyl group having 1 to 20 carbon atoms, or an aryl group having 6 to 20 carbon atoms. The alkyl group having 1 to 20 carbon atoms and the aryl group having 6 to 20 carbon atoms, which are represented by $R^5$ and $R^6$, have the same definitions as in the case of $R^1$ and $R^2$, respectively, and likewise have the same preferable definitions.

Among these, $R^3$ and $R^4$ are each preferably an acyl group, a carbamoyl group, an alkyloxycarbonyl group, an aryloxycarbonyl group, a cyano group, a nitro group, an alkylsulfonyl group, an arylsulfonyl group, a sulfonyloxy group, or a sulfamoyl group, and particularly, an acyl group, a carbamoyl group, an alkyloxycarbonyl group, an aryloxycarbonyl group, a cyano group, an alkylsulfonyl group, an arylsulfonyl group, a sulfonyloxy group and a sulfamoyl group are preferable.

Furthermore, the compound mentioned above may be in the form of a polymer derived from a monomer in which at least one of $R^1$, $R^2$, $R^3$ and $R^4$ is linked to a vinyl group via a linking group.

Specific preferred examples of the compound represented by the formula (1) [example compounds (1) to (14)] are presented below. However, the invention is not intended to be limited to these. Here, n means normal.

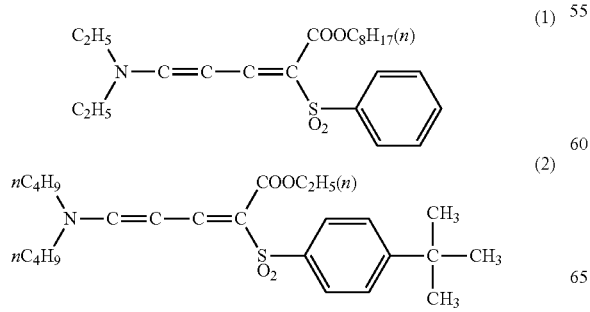

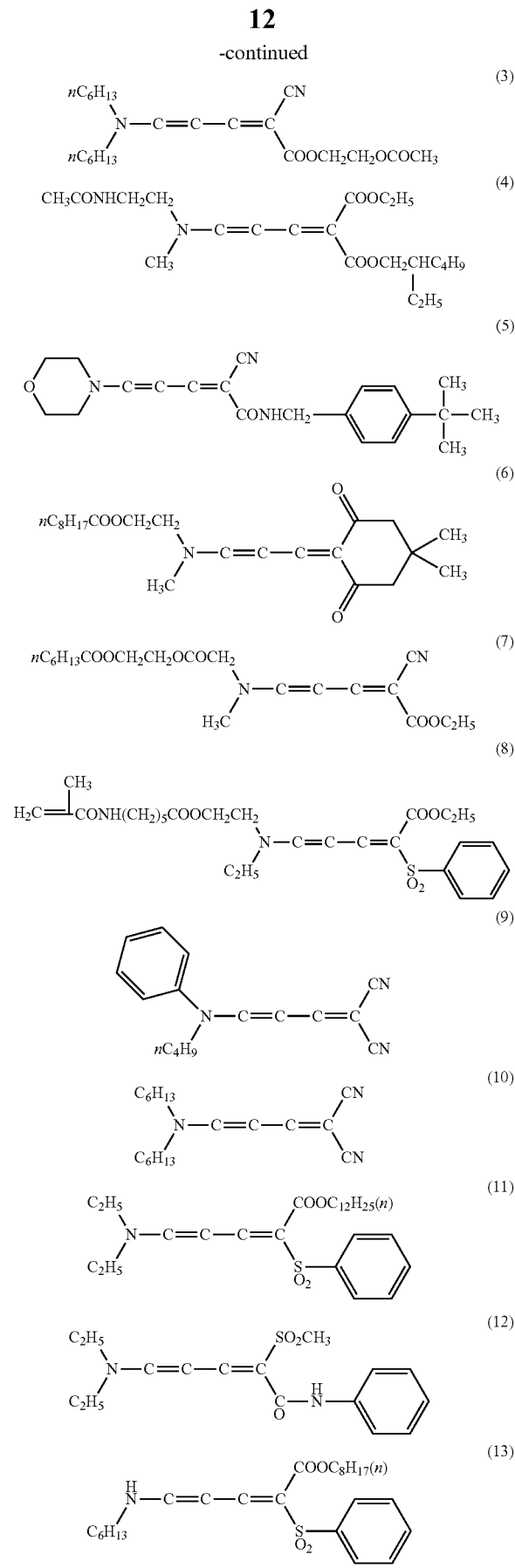

-continued

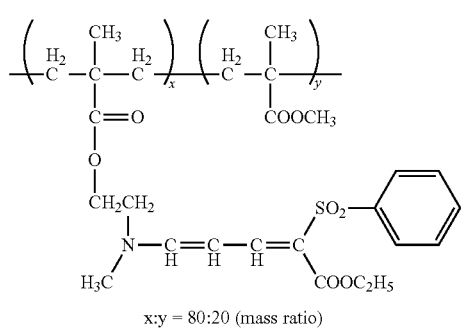

x:y = 80:20 (mass ratio)

The content of the compound represented by the formula (1) (conjugated diene-based compound) in the photocurable colored composition of the invention is preferably 0.01% by mass to 10% by mass, more preferably 0.01% by mass to 7.5% by mass, and particularly preferably 0.01% by mass to 5% by mass, relative to total solid content of the composition. When the content of this conjugated diene-based compound (ultraviolet absorber) is 0.01% by mass or more, the light shielding ability at the time of exposure is satisfactory, and enlargement of the pattern line width caused by excessive progress of polymerization is prevented, so that a desired line width is easily obtained. Furthermore, the generation of residues in the surroundings is also further suppressed. When the content is 10% by mass or less, the light shielding ability at the time of exposure is not excessively strong, and polymerization proceeds more satisfactorily.

Such changes in the pattern line width as described above are conspicuous in a photocurable colored composition of magenta color or red color, which has less light absorption against ultraviolet rays such as g-line, h-line and i-line as the exposure light sources. Accordingly, the compound represented by the formula (1) (conjugated diene-based compound) is particularly effective when a photocurable colored composition of magenta color or red color is constituted.

(Compound Represented by Formula (2))

As an (C) i-line absorber according to the invention, a compound represented by the following formula (2) is suitable.

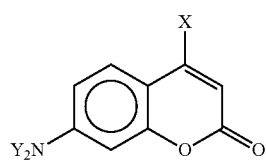

Formula (2)

In the formula (2), X represents an alkyl group having 1 to 20 carbon atoms, an unsubstituted cyclic ring group or substituted cyclic ring group linked at the 3-position, a carboxyl group, or a carboxylic acid ester residue; Y represents a hydrogen atom, an alkyl group having 1 to 20 carbon atoms, an unsubstituted cyclic ring group or substituted cyclic ring group linked at the 6-position, an unsubstituted cyclic ring group or substituted cyclic ring group linked at the 8-position, or an unsubstituted cyclic ring group or substituted cyclic ring group linked at the 6-position and the 8-position; and each Y may be identical to or different from another Y.

The alkyl group having 1 to 20 carbon atoms, which is represented by X, preferably has 1 to 10 carbon atoms, more preferably 1 to 5 carbon atoms, and particularly preferably 1 to 3 carbon atoms. Specific examples of the alkyl group include methyl, ethyl, propyl, n-butyl, tert-butyl, iso-butyl, pentyl, hexyl and cyclohexyl, and among them, methyl, ethyl and propyl are particularly preferred.

As the cyclic ring group in the unsubstituted cyclic ring group or substituted cyclic ring group linked at the 3-position as represented by X, the unsubstituted cyclic ring group or substituted cyclic ring group linked at the 6-position as represented by Y, the unsubstituted cyclic ring group or substituted cyclic ring group linked at the 8-position as represented by Y, and the unsubstituted or substituted cyclic ring group linked at the 6-position and the 8-position as represented by Y, a 3- to 12-membered ring is preferred, a 4- to 9-membered ring is more preferred, and a 5- to 7-membered ring is particularly preferred.

Specific examples of the cyclic ring group include cyclobutane, cyclopentane, and cyclohexane, and cyclopentane and cyclohexane are particularly preferred.

An example of the substituent may be an alkyl group (preferably having 1 to 10 carbon atoms, more preferably 1 to 5 carbon atoms, and particularly preferably 1 to 3 carbon atoms, and examples include methyl, ethyl, propyl, n-butyl, tert-butyl, iso-butyl, pentyl, hexyl and cyclohexyl; among them, methyl, ethyl and propyl are preferred).

Examples of the carboxylic acid ester residue represented by X include a dimethyl ester group, an ethyl methyl ester group, and a methyl phenyl ester group, and among them, a dimethyl ester group and an ethyl methyl ester group are preferred.

The alkyl group having 1 to 20 carbon atoms as represented by Y preferably has 1 to 10 carbon atoms, more preferably 1 to 5 carbon atoms, and particularly preferably 1 to 3 carbon atoms. Specific examples include methyl, ethyl, propyl, n-butyl, tert-butyl, iso-butyl, pentyl, hexyl, and cyclohexyl, and among them, methyl, ethyl and propyl are particularly preferred.

The unsubstituted or substituted cyclic ring groups linked at the 6-position and the 8-position, as represented by Y, may be identical to or different from each other, but it is preferable that the groups be identical.

Among the compounds represented by the formula (2), preferred examples include compounds represented by at least one of formula (3) and the following formula (4).

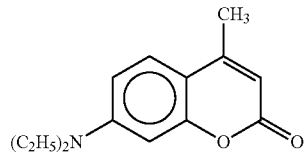

Formula (3)

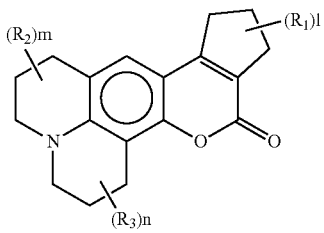

Formula (4)

In the formula (4), $R_1$, $R_2$ and $R_3$ each independently represent hydrogen or an alkyl group having 1 to 20 carbon atoms; and l, m and n each independently represent an integer of 1 or 2.

The alkyl group having 1 to 20 carbon atoms as represented by $R_1$ to $R_3$ has the same definition as the alkyl group represented by X, and also has the same preferable definition.

Furthermore, specific examples are the same, and preferable examples are also the same.

l, m and n each independently represent an integer of 1 or 2. When l, m and n each represent 2, $R_1$, $R_2$ and $R_3$ may be respectively identical to or different from each other.

Among the compounds represented by the formula (2), more preferred examples include a compound represented by the following formula (5).

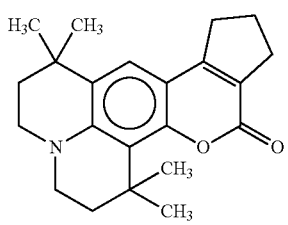

Formula (5)

As specific examples of the 4,7-position-substituted coumarin-based compound represented by the formula (2) according to the invention, compounds other than the compounds represented by the formulas (3) and (5) are presented below, but the invention is not intended to be limited to these.

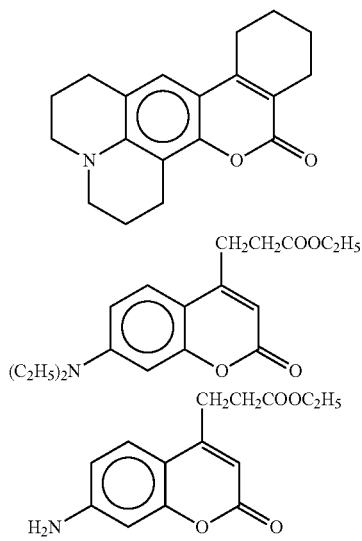

The content of the (C) i-line absorber explained thus far is preferably 1 to 20% by mass, and more preferably 1 to 10% by mass, relative to total solid content of the curable composition of the invention.

<(D) Photopolymerization Initiator>

The curable composition of the invention contains at least one (D) photopolymerization initiator.

The photopolymerization initiator is a compound that is decomposed by light and initiates and promotes polymerization of a polymerizable compound, and a compound having absorption in the wavelength region of 300 to 500 nm is preferred. Furthermore, the photopolymerization initiator may be used singly, or two or more kinds may be used together.

Examples of the photopolymerization initiator include an organic halogenated compound, an oxydiazole compound, a carbonyl compound, a ketal compound, a benzoin compound, an acridine compound, an organic peroxide compound, an azo compound, a coumarin compound, an azide compound, a metallocene compound, a hexaarylbiimidazole compound, an organic boric acid compound, a disulfonic acid compound, an oxime ester compound, an onium salt compound, and an acylphosphine (oxide) compound.

Specific examples of the organic halogenated compound include the compounds described in Wakabayashi et al., "Bull. Chem. Soc. Japan", 42, 2924 (1969), U.S. Pat. No. 3,905,815, JP-B-46-4605, JP-A-48-36281, JP-A-55-32070, JP-A-60-239736, JP-A-61-169835, JP-A-61-169837, JP-A-62-58241, JP-A-62-212401, JP-A-63-70243 or JP-A-63-298339, M. P. Hutt, "Journal of Heterocyclic Chemistry", 1 (No. 3), (1970), or the like. Particularly, an oxazole compound substituted by a trihalomethyl group, and an s-triazine compound may be mentioned.

The s-triazine compound is more suitably an s-triazine derivative in which at least one mono-, di- or trihalogen-substituted methyl group is bound to an s-triazine ring, and specific examples include 2,4,6-tris(monochloromethyl)-s-triazine, 2,4,6-tris(dichloromethyl)-s-triazine, 2,4,6-tris(trichloromethyl)-s-triazine, 2-methyl-4,6-bis(trichloromethyl)-s-triazine, 2-n-propyl-4,6-bis(trichloromethyl)-s-triazine, 2-(α,α,β-trichloroethyl)-4,6-bis(trichloromethyl)-s-triazine, 2-phenyl-4,6-bis(trichloromethyl)-s-triazine, 2-(p-methoxyphenyl)-4,6-bis(trichloromethyl)-s-triazine, 2-(3,4-epoxyphenyl)-4,6-bis(trichloromethyl)-s-triazine, 2-(p-chlorophenyl)-4,6-bis(trichloromethyl)-s-triazine, 2-[1-(p-methoxyphenyl)-2,4-butadienyl]-4,6-bis(trichloromethyl)-s-triazine, 2-styryl-4,6-bis(trichloromethyl)-s-triazine, 2-(p-methoxystyryl)-4,6-bis(trichloromethyl)-s-triazine, 2-(p-i-propyloxystyryl)-4,6-bis(trichloromethyl)-s-triazine, 2-(p-tolyl)-4,6-bis(trichloromethyl)-s-triazine, 2-(4-nathoxynaphthyl)-4,6-bis(trichloromethyl)-s-triazine, 2-phenylthio-4,6-bis(trichloromethyl)-s-triazine, 2-benzylthio-4,6-bis(trichloromethyl)-s-triazine, 2,4,6-tris(dibromomethyl)-s-triazine, 2,4,6-tris(tribromomethyl)-s-triazine, 2-methyl-4,6-bis(tribromomethyl)-s-triazine, and 2-methoxy-4,6-bis(tribromomethyl)-s-triazine.

Examples of the oxydiazole compound include 2-trichloromethyl-5-styryl-1,3,4-oxodiazole, 2-trichloromethyl-5-(cyanostyryl)-1,3,4-oxodiazole, 2-trichloromethyl-5-(naphth-1-yl)-1,3,4-oxodiazole, and 2-trichloromethyl-5-(4-styryl)styryl-1,3,4-oxodiazole.

Examples of the carbonyl compound include benzophenone derivatives such as benzophenone, Michler's ketone, 2-methylbenzophenone, 3-methylbenzophenone, 4-methylbenzophenone, 2-chlorobenzophenone, 4-bromobenzophenone, and 2-carboxybenzophenone; acetophenone derivatives such as 2,2-dimethoxy-2-phenylacetophenone, 2,2-diethoxyacetophenone, 1-hydroxycyclohexyl phenyl ketone, α-hydtoxy-2-methylphenyl propanone, 1-hydroxy-1-methylethyl-(p-isopropylphenyl) ketone, 1-hydroxy-1-(p-dodecylphenyl) ketone, 2-methyl-(4'-(methylthio)phenyl)-2-morpholino-1-propanone, 1,1,1-trichloromethyl-(p-butylphenyl) ketone, and 2-benzyl-2-dimethylamino-4-morpholinobutyrophenone; thioxanthone derivatives such as thioxanthone, 2-ethylthioxanthone, 2-isopropylthioxanthone, 2-chlorothioxanthone, 2,4-dimethylthioxanthone, 2,4-diethylthioxanthone, and 2,4-diisopropylthioxanthone; and benzoic acid ester derivatives such as ethyl p-dimethylaminobenzoate, and ethyl p-diethylaminobenzoate.

Examples of the ketal compound include benzyl methyl ketal and benzyl-β-methoxyethyl ethyl acetal.

Examples of the benzoin compound include m-benzoin isopropyl ether, benzoin isobutyl ether, benzoin methyl ether, and methyl-o-benzoyl benzoate.

Examples of the acridine compound include 9-phenylacridine and 1,7-bis(9-acridinyl)heptane.

Examples of the organic peroxide compound include trimethylcyclohexanone peroxide, acetylacetone peroxide, 1,1-bis(tert-butylperoxy)-3,3,5-trimethylcyclohexane, 1,1-bis(tert-butylperoxy)cyclohexane, 2,2-bis(tert-butylperoxy)butane, tert-butyl hydroperoxide, cumene hydroperoxide, diisopropylbenzene hydroperoxide, 2,5-dimethylhexane-2,5-dihydroperoxide, 1,1,3,3-tetramethylbutyl hydroperoxide, tert-butylcumyl peroxide, dicumyl peroxide, 2,5-dimethyl-2,5-di(tert-butylperoxy)hexane, 2,5-oxanoyl peroxide, succinic acid peroxide, benzoyl peroxide, 2,4-dichlorobenzoyl peroxide, diisopropylperoxy dicarbonate, di-2-ethylhexylperoxy dicarbonate, di-2-ethoxyethylperoxy dicarbonate, dimethoxyisopropylperoxy carbonate, di(3-methyl-3-methoxybutyl)peroxy dicarbonate, tert-butylperoxy acetate, tert-butylperoxy pivalate, tert-butylperoxy neodecanoate, tert-butylperoxy octanoate, tert-butylperoxy laurate, tersyl carbonate, 3,3',4,4'-tetra-(t-butylperoxycarbonyl)benzophenone, 3,3',4,4'-tetra-(t-hexylperoxycarbonyl)benzophenone, 3,3',4,4'-tetra-(p-isopropylcumylperoxycarbonyl)benzophenone, carbonyl di(t-butylperoxy dihydrogen diphthalate), and carbonyl di(t-hexylperoxy dihydrogen diphthalate).

Examples of the azo compound include the azo compounds described in JP-A-8-108621.

Examples of the coumarin compound include 3-methyl-5-amino-((s-triazin-2-yl)amino)-3-phenylcoumarin, 3-chloro-5-diethylamino-((s-triazin-2-yl)amino)-3-phenylcoumarin, and 3-butyl-5-dimethylamino-((s-triazin-2-yl)amino)-3-phenylcoumarin.

Examples of the azide compound include the organic azide compounds described in U.S. Pat. No. 2,848,328, U.S. Pat. No. 2,852,379 and U.S. Pat. No. 2,940,853; and 2,6-bis(4-azidobenzylidene)-4-ethylcyclohexanone (BAC-E).

Examples of the metallocene compound include the various titanocene compounds described in JP-A-59-152396, JP-A-61-151197, JP-A-63-41484, JP-A-2-249, JP-A-2-4705 and JP-A-5-83588, for example, dicyclopentadienyl-Ti-bisphenyl, dicyclopentadienyl-Ti-bis-2,6-difluorophen-1-yl, dicyclopentadienyl-Ti-bis-2,4-difluorophen-1-yl, dicyclopentadienyl-Ti-bis-2,4,6-trifluorophen-1-yl, dicyclopentadienyl-Ti-bis-2,3,5,6-tetrafluorophen-1-yl, dicyclopentadienyl-Ti-bis-2,3,4,5,6-pentafluorophen-1-yl, dimethylcyclopentadienyl-Ti-bis-2,6-difluorophen-1-yl, dimethylcyclopentadienyl-Ti-bis-2,4,6-trifluorophen-1-yl, dimethylcyclopentadienyl-Ti-bis-2,3,5,6-tetrafluorophen-1-yl, and dimethylcyclopentadienyl-Ti-bis-2,3,4,5,6-pentafluorophen-1-yl; and the iron-arene complexes described in JP-A-1-304453 and JP-A-1-152109.

Examples of the hexaarylbiimidazole compound include the various compounds described in JP-B-6-29285, U.S. Pat. Nos. 3,479,185, 4,311,783 and 4,622,286, specifically, 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl) biididazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole, and 2,2'-bis(o-trifluorophenyl)-4,4',5,5'-tetraphenylbiimidazole.

Examples of the organic borate compound include the organic borates described in JP-A-62-143044, JP-A-62-150242, JP-A-9-188685, JP-A-9-188686, JP-A-9-188710, JP-A-2000-131837, JP-A-2002-107916, Japanese Patent No. 2764769, Japanese Patent Application No. 2000-310808 and Kunz, Martin "Rad Tech '98. Proceeding Apr. 19-22, 1998, Chicago"; the organic boron-sulfonium complexes or organic boron-oxosulfonium complexes described in JP-A-6-157623, JP-A-6-175564 and JP-A-6-175561; organic boron-iodonium complexes described in JP-A-6-175554 and JP-A-6-175553; organic boron-phosphonium complexes described in JP-A-9-188710; and organic boron-transition metal coordinated complexes described in JP-A-6-348011, JP-A-7-128785, JP-A-7-140589, JP-A-7-306527, and JP-A-7-292014.

Examples of the disulfone compound include the compounds described in JP-A-61-166544 and Japanese Patent Application No. 2001-132318.

Examples of the oxime ester compound include the compounds described in J. C. S. Perkin II (1979) 1653-1660, J. C. S. Perkin II (1979) 156-162, Journal of Photopolymer Science and Technology (1995) 202-232, and JP-A-2000-66385; and the compounds described in JP-A-2000-80068 and Japanese National Phase Publication No. 2004-534797.

Examples of the onium salt compound include the diazonium salts described in S. I. Schlesinger, Photogr. Sci. Eng., 18, 387 (1974), and T. S. Bal et al., Polymer, 21, 423 (1980); the ammonium salts described in U.S. Pat. No. 4,069,055 and JP-A-4-365049; the phosphonium salts described in U.S. Pat. Nos. 4,069,055 and 4,069,056; and the iodonium salts described in EP No. 104,143, U.S. Pat. Nos. 339,049 and 410,201, JP-A-2-150848 and JP-A-2-296514.

An iodonium salt that may be suitably used in the invention is a diaryliodonium salt, and from the viewpoint of stability, the diaryliodonium salt is preferably substituted with two or more electron-donating groups such as an alkyl group, an alkoxy group and an aryloxy group. As another preferable form of a sulfonium salt, an iodonium salt in which one substituent of a triarylsulfonium salt has a coumarin or anthraquinone structure, and which has absorption at a wavelength of 300 nm or more, is preferred.

Examples of sulfonium salts that may be suitably used in the invention include the sulfonium salts described in EP Nos. 370,693, 390, 214, 233, 567, 297,443 and 297,442, U.S. Pat. Nos. 4,933,377, 161, 811, 410, 201, 339,049, 4,760,013, 4,734,444 and 2,833,827, and German Patent Nos. 2,904, 626, 3,604,580 and 3,604,581. From the viewpoint of stability and sensitivity, a sulfonium salt substituted with an electron-withdrawing group is preferred. The electron-withdrawing group is preferably such a group having a Hammett value of higher than zero. Preferred examples of the electron-withdrawing group include a halogen atom and a carboxylic acid.

In addition, other preferable examples of sulfonium salts include a sulfonium salt in which one substituent of a triarylsulfonium salt has a coumarin or anthraquinone structure, and which has absorption at 300 nm or more. Another preferable sulfonium salt may be a triarylsulfonium salt having an aryloxy group or an arylthio group as a substituent and having absorption at 300 nm or more.

Examples of the onium salt compound include onium salts such as the selenonium salts described in J. V. Crivello et al., Macromolecules, 10(6), 1307 (1977), and J. V. Crivello et al., J. Polymer Sci., Polymer Chem. Ed., 17, 1047 (1979); and the arsonium salts described in C. S. Wen et al., Teh, Proc. Conf. Rad. Curing ASIA, p478 Tokyo, October (1988).

Examples of the acylphosphine (oxide) compound include IRGACURE 819, DAROCURE 4265 and DAROCURE TPO (trade names, manufactured by Ciba Specialty Chemicals, Inc.).

The (C) photopolymerization initiator used in the invention is preferably, from the viewpoint of exposure sensitivity, a compound selected from the group consisting of a trihalomethyltriazine-based compound, a benzyl dimethyl ketal compound, an α-hydroxyketone compound, an α-aminoketone compound, an acylphosphine-based compound, a phosphine oxide-based compound, a metallocene compound, an oxime-based compound, a biimidazole-based compound, an onium-based compound, a benzothiazole-based compound, a benzophenone-based compound, an acetophenone-based compound and derivatives thereof, a cyclopentadiene-benzene-iron complex and salts thereof, a halomethyloxadiazole compound, and a 3-aryl-substituted coumarin compound.

More preferable examples include a trihalomethyltriazine-based compound, an α-aminoketone compound, an acylphosphine-based compound, a phosphine oxide-based compound, an oxime-based compound, a biimidazole-based compound, an onium-based compound, a benzophenone-based compound, and an acetophenone-based compound, and at least one compound selected from the group consisting of a trihalomethyltriazine-based compound, an α-aminoketone compound, an oxime-based compound, a biimidazole-based compound and a benzophenone-based compound, is even more preferred.

Furthermore, from the viewpoint of further suppressing development residues, an oxime-based compound such as the oxime ester compound described above (that is, an oxime-based photopolymerization initiator) is most preferred.

Examples of the oxime-based photopolymerization initiator include the oxime ester compounds mentioned above, but in addition to those, for example, the oxime-based compounds described in JP-A-2000-80068, WO 02/100903 A1, JP-A-2001-233842 and the like may be used.

Specific examples include 2-(O-benzoyloxime)-1-[4-(phenylthio)phenyl]-1,2-butanedione, 2-(O-benzoyloxime)-1-[4-(phenylthio)phenyl]-1,2-pentanedione, 2-(O-benzoyloxime)-1-[4-(phenylthio)phenyl]-1,2-hexanedione, 2-(O-benzoyloxime)-1-[4-(phenylthio)phenyl]-1,2-heptanedione, 2-(O-benzoyloxime)-1-[4-(phenylthio)phenyl]-1,2-octanedione, 2-(O-benzoyloxime)-1-[4-(methylphenylthio)phenyl]-1,2-butanedione, 2-(O-benzoyloxime)-1-[4-(ethylphenylthio)phenyl]-1,2-butanedione, 2-(O-benzoyloxime)-1-[4-(butylphenylthio)phenyl]-1,2-butanedione, 1-(O-acetyloxime)-1-[9-ethyl-6-(2-methylbenzoyl)-9H-carbazol-3-yl]ethanone, 1-(O-acetyloxime)-1-[9-methyl-6-(2-methylbenzoyl)-9H-carbazol-3-yl]ethanone, 1-(O-acetyloxime)-1-[9-propyl-6-(2-methylbenzoyl)-9H-carbazol-3-yl]ethanone, 1-(O-acetyloxime)-1-[9-ethyl-6-(2-ethylbenzoyl)-9H-carbazol-3-yl]ethanone, and 1-(O-acetyloxime)-1-[9-ethyl-6-(2-butylbenzoyl)-9H-carbazol-3-yl]ethanone. However, the oxime-based photopolymerization initiator is not intended to be limited to these.

Among those mentioned above, most preferred examples of the oxime-based photopolymerization initiator include 2-(O-benzoyloxime)-1-[4-(phenylthio)phenyl]-1,2-octanedione, and 1-(O-acetyloxime)-1-[9-ethyl-6-(2-methylbenzoyl)-9H-carbazol-3-yl]ethanone. Such oxime-based photopolymerization initiators include CGI-124 and CGI-242 (trade names, manufactured by Ciba Specialty Chemicals, Inc.).

The content of the (D) photopolymerization initiator contained in the curable composition of the invention is preferably 0.1 to 50% by mass, more preferably 0.5 to 30% by mass, and particularly preferably 1 to 20% by mass, relative to total solid content of the curable composition. When the content is in this range, satisfactory sensitivity and pattern formability are obtained.

<(E) Alkali-Soluble Resin>

The curable composition of the invention contains at least one (E) alkali-soluble resin.

As the (E) alkali-soluble resin, it is preferable to use a linear organic polymer.

Any known polymer may be used as such a "linear organic polymer". Preferably, a linear organic polymer which is soluble or swellable in water or weak alkaline water is selected so as to enable development with water or development with weak alkaline water. The linear organic polymer is selected and used in accordance with the use not only as a film forming agent but also as a water-, weak alkaline water- or organic solvent-based developer. For example, when a water-soluble organic polymer is used, development with water is made possible. Such a linear organic polymer may be a radical polymer having a carboxylic acid group in a side chain, and examples include the polymers described in JP-A-59-44615, JP-B-54-34327, JP-B-58-12577, JP-B-54-25957, JP-A-54-92723, JP-A-59-53836 and JP-A-59-71048, that is, a resin produced by homopolymerizing or copolymerizing a monomer having a carboxyl group; a resin produced by homopolymerizing or copolymerizing a monomer having an acid anhydride and subjecting the acid anhydride unit to hydrolysis, half-esterification or half-amidation; and epoxy acrylate produced by modifying an epoxy resin with an unsaturated monocarboxylic acid and an acid anhydride. Examples of the monomer having a carboxyl group include acrylic acid, methacrylic acid, itaconic acid, crotonic acid, maleic acid, fumaric acid and 4-carboxylstyrene, and examples of the monomer having an acid anhydride include maleic anhydride.

Similarly, there are also available acidic cellulose derivatives having a carboxylic acid group in a side chain. In addition to these, products produced by adding a cyclic acid anhydride to a polymer having a hydroxyl group, and the like are useful.

In the case of using a copolymer as the alkali-soluble resin according to the invention, as for the compound to be copolymerized, monomers other than the monomers mentioned above may be used. Examples of the other monomers include compounds of the following (1) to (12).

(1) Acrylic acid esters and methacrylic acid esters, each having an aliphatic hydroxyl group, such as 2-hydroxyethyl acrylate, 2-hydroxypropyl acrylate, 3-hydroxypropyl acrylate, 4-hydroxybutyl acrylate, 2-hydroxyethyl methacrylate, 2-hydroxypropyl methacrylate, 3-hydroxypropyl methacrylate, and 4-hydroxybutyl methacrylate;

(2) alkyl acrylates, such as methyl acrylate, ethyl acrylate, propyl acrylate, butyl acrylate, isobutyl acrylate, amyl acrylate, hexyl acrylate, 2-ethylhexyl acrylate, octyl acrylate, benzyl acrylate, 2-chloroethyl acrylate, glycidyl acrylate, 3,4-epoxycyclohexylmethyl acrylate, vinyl acrylate, 2-phenylvinyl acrylate, 1-propenyl acrylate, allyl acrylate, 2-allyloxyethyl acrylate and propargyl acrylate;

(3) alkyl methacrylates, such as methyl methacrylate, ethyl methacrylate, propyl methacrylate, butyl methacrylate, isobutyl methacrylate, amyl methacrylate, hexyl methacrylate, 2-ethylhexyl methacrylate, cyclohexyl methacrylate, benzyl methacrylate, 2-chloroethyl methacrylate, glycidyl methacrylate, 3,4-epoxycyclohexylmethyl methacrylate, vinyl methacrylate, 2-phenylvinyl methacrylate, 1-propenyl methacrylate, allyl methacrylate, 2-allyloxyethyl methacrylate, and propargyl methacrylate;

(4) acrylamides or methacrylamides, such as acrylamide, methacrylamide, N-methylol acrylamide, N-ethyl acrylamide, N-hexyl methacrylamide, N-cyclohexyl acrylamide, N-hydroxyethyl acrylamide, N-phenyl acrylamide, N-nitrophenyl acrylamide, N-ethyl-N-phenyl acrylamide, vinyl acrylamide, vinyl methacrylamide, N,N-diallyl acrylamide, N,N-diallyl methacrylamide, allyl acrylamide, and allyl methacrylamide;

(5) vinyl ethers, such as ethyl vinyl ether, 2-chloroethyl vinyl ether, hydroxyethyl vinyl ether, propyl vinyl ether, butyl vinyl ether, octyl vinyl ether, and phenyl vinyl ether;

(6) vinyl esters, such as vinyl acetate, vinyl chloroacetate, vinyl butyrate, and vinyl benzoate;

(7) styrenes such as styrene, α-methylstyrene, methylstyrene, chloromethylstyrene, and p-acetoxystyrene;

(8) vinyl ketones, such as methyl vinyl ketone, ethyl vinyl ketone, propyl vinyl ketone, and phenyl vinyl ketone;

(9) olefins, such as ethylene, propylene, isobutylene, butadiene, and isoprene;

(10) N-vinylpyrrolidone, acrylonitrile, methacrylonitrile, and the like;

(11) unsaturated imides, such as maleimide, N-acryloyl acrylamide, N-acetyl methacrylamide, N-propionyl methacrylamide, and N-(p-chlorobenzoyl)methacrylamide; and

(12) methacrylic acid-based monomers each having a heteroatom bonded to the α-position, for example, the compounds described in Japanese Patent Application No. 2001-115595 and Japanese Patent Application No. 2001-115598.

Among these, (meth)acrylic resins each having an allyl group or a vinyl ester group and a carboxyl group in a side chain, and alkali-soluble resins each having a double bond in a side chain, such as described in JP-A-2000-187322 and JP-A-2002-62698, or alkali-soluble resins each having an amide group in a side chain, such as described in JP-A-2001-242612, are suitable since they are excellent in the balance between film strength, sensitivity and developability.

Urethane-based binder polymers each containing an acid group, such as described in JP-B-7-12004, JP-B-7-120041, JP-B-7-120042, JP-B-8-12424, JP-A-63-287944, JP-A-63-287947, JP-A-1-271741, and Japanese Patent Application No. 10-116232; or urethane-based binder polymers each having an acid group and a double bond in a side chain, such as described in JP-A-2002-107918, are very excellent in strength, and are therefore advantageous in terms of print resistance and low exposure suitability.

Furthermore, acetal-modified polyvinyl alcohol-based binder polymers having an acid group, such as described in EP No. 993966, EP No. 1204000 and JP-A-2001-318463 are excellent in the balance between film strength and developability, and are suitable.

In addition to these, polyvinylpyrrolidone, polyethylene oxide and the like are useful as the water-soluble linear organic polymer. Also, in order to increase the strength of the cured film, an alcohol-soluble nylon, a polyether of 2,2-bis-(4-hydroxyphenyl)-propane and epichlorohydrin, and the like are also useful.

As the alkali-soluble resin of the invention, an alkali-soluble resin containing an ethylenically unsaturated double bond is preferable among the resins described above, and an alkali-soluble resin containing an acryloyl group or a methacryloyl group is more preferable.

The weight average molecular weight of the alkali-soluble resin contained in the curable composition according to the invention is preferably 5,000 or more, and more preferably in the range of 10,000 to 300,000, and the number average molecular weight is preferably 1,000 or more, and more preferably in the range of 2,000 to 250,000. The polydispersity (weight average molecular weight/number average molecular weight) is preferably 1 or more, and more preferably in the range of 1.1 to 10.

Such a resin may be any of a random polymer, a block polymer, a graft polymer and the like.

The alkali-soluble resin according to the invention may be synthesized by a conventionally known method. Examples of the solvent used upon synthesis include tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethylformamide, N,N-dimethylacetamide, toluene, ethyl acetate, methyl lactate, ethyl lactate, dimethyl sulfoxide, and water. These solvents are used singly or as mixtures of two or more kinds.

Examples of the radical polymerization initiator used when the resin according to the invention is synthesized, include known compounds such as azo-based initiators and peroxide initiators.

The content of the alkali-soluble resin (total content in the case of two or more resins) in total solid content of the curable composition of the invention is not particularly limited, but from the viewpoint of obtaining the effects of the invention more effectively, the content is preferably 1 to 80% by mass, more preferably 1 to 70% by mass, and particularly preferably 1 to 60% by mass.

<(F) Pigment>

The curable composition of the invention contains at least one pigment.

The pigment is not particularly limited, and various conventionally known pigments may be used singly or as mixtures of two or more kinds.

As the pigment, various conventionally known inorganic pigments or organic pigments may be used. Furthermore, when it is considered that both the inorganic pigments and the organic pigments preferably have high transmittances, it is preferable to use a pigment as fine as possible, and when handlability is also considered, the average particle size of the pigment is preferably 0.01 to 0.1 μm, and more preferably 0.01 to 0.05 μm.

Examples of the inorganic pigment include metal compounds such as metal oxides and metal complex salts. Specific examples include oxides of metals such as iron, cobalt, aluminum, cadmium, lead, copper, titanium, magnesium, chromium, zinc and antimony, and composite oxides of those metals.

Examples of the organic pigment include:

C.I. Pigment Yellow 11, 24, 31, 53, 83, 93, 99, 108, 109, 110, 138, 139, 147, 150, 151, 154, 155, 167, 180, 185, 199;

C.I. Pigment Orange 36, 38, 43, 71;

C.I. Pigment Red 81, 105, 122, 149, 150, 155, 166, 171, 175, 176, 177, 209, 220, 224, 242, 254, 255, 264, 270;

C.I. Pigment Violet 19, 23, 32, 39;

C.I. Pigment Blue 1, 2, 15, 15:1, 15:3, 15:6, 16, 22, 60, 66;

C.I. Pigment Green 7, 36, 37;

C.I. Pigment Brown 25, 28; and

C.I. Pigment Black 1, 7.

According to the invention, a pigment having a basic nitrogen (N) atom in the structure of the pigment may be particularly preferably used. A pigment having a basic N atom exhibits satisfactory dispersibility in the composition. The reason has not been satisfactorily elucidated, but it is speculated that good affinity between the photosensitive polymerization component and the pigment is affecting the dispersibility.

Preferred examples of the pigment include the following. However, the invention is not intended to be limited to these.

C.I. Pigment Yellow 11, 24, 108, 109, 110, 138, 139, 150, 151, 154, 167, 180, 185, C.I. Pigment Orange 36, 71, C.I. Pigment Red 122, 150, 166, 171, 175, 177, 209, 224, 242, 254, 255, 264, C.I. Pigment Violet 19, 23, 32, C.I. Pigment Blue 15:1, 15:3, 15:6, 16, 22, 60 and 66.

These organic pigments may be used singly, or in various combinations in order to increase color purity. Specific examples of the combinations are presented below.

For example, as a pigment for red color, an anthraquinone-based pigment, a perylene-based pigment or a diketopyrrolopyrrole-based pigment alone, or a mixture of at least one of these pigments with a disazo-based yellow pigment, an isoindoline-based yellow pigment, a quinophthalone-based yellow pigment or a perylene-based red pigment, and the like may be used. For example, an anthraquinone-based pigment may be a C.I. Pigment Red 177, a perylene-based pigment may be C.I. Pigment Red 155 or C.I. Pigment Red 224, and a diketopyrrolopyrrole pigment may be C.I. Pigment Red 254. From the viewpoint of color reproducibility, mixtures of these pigments with C.I. Pigment Yellow 139 are preferred. Furthermore, the mass ratio of the red pigment and the yellow pigment is preferably 100:5 to 100:50. When the mass ratio is within this range, light transmittance at 400 nm to 500 nm may be suppressed so that it is effective in increasing the color purity, and the main wavelength is suppressed from being composed of a short wavelength, so that color reproducibility is easily secured. A mass ratio in the range of 100:30 to 100:50 in particular is optimal. In the case of a combination of a red pigment with a red pigment, the mass ratio may be adjusted in accordance with the chromaticity.

As a pigment for green color, a halogenated phthalocyanine-based pigment alone, or a mixture of this with a disazo-based yellow pigment, a quinophthalone-based yellow pigment, an azomethine-based yellow pigment or an isoindoline-based yellow pigment, may be used. Preferable examples of such a mixture include mixtures of C.I. Pigment Green 7, 36 and 37, with C.I. Pigment Yellow 83, C.I. Pigment Yellow 138, C.I. Pigment Yellow 139, C.I. Pigment Yellow 150, C.I. Pigment Yellow 180 or C.I. Pigment Yellow 185. The mass ratio of the green pigment and the yellow pigment is preferably 100:5 to 100:150, and particularly preferably in the range of 100:30 to 100:120.

As a pigment for blue color, a phthalocyanine-based pigment alone, or a mixture of this with a dioxazine-based violet pigment may be used. For example, a mixture of C.I. Pigment Blue 15:6 and C.I. Pigment Violet 23 is preferable. The mass ratio of the blue pigment and the violet pigment is preferably 100:0 to 100:30, and more preferably 100:10 to 100:30.

From the viewpoint of color unevenness or contrast upon production of a color filter, the primary particle size of the pigment is preferably 10 to 100 nm, more preferably 10 to 70 nm, even more preferably 10 to 50 nm, and most preferably 10 to 40 nm.

The content of the pigment in the curable composition is preferably 20% by mass or more, more preferably 30% by mass or more, and particularly preferably 30 to 70% by mass, relative to total solid content of the curable composition. When the content of the pigment is within the range mentioned above, a colored pattern with a satisfactory color at high density may be obtained, and it is preferable from the viewpoint of obtaining a vivid color filter with high contrast.

(Dispersant)

The curable composition according to the invention preferably contains at least one dispersant, from the viewpoint of enhancing the dispersibility of the (F) pigment.

Examples of the dispersant (pigment dispersant) that may be used in the invention include polymeric dispersants [for example, polyamideamines and salts thereof, polycarboxylic acids and salts thereof, high molecular weight unsaturated acid esters, modified polyurethanes, modified polyesters, modified poly(meth)acrylates, (meth)acrylic copolymers, naphthalene-sulfonic acid-formalin condensate], and polyoxyethylene alkyl phosphoric acid esters, polyoxyethylene alkylamines, alkanolamines, and pigment derivatives.

The polymeric dispersants may be further classified, on the basis of their structures, into straight-chained polymers, terminal-modified type polymers, graft type polymers and block type polymers.

The polymeric dispersants exert their action so as to adsorb to the surface of pigments and to prevent reaggregation. For this reason, terminal-modified type polymers, graft type polymers and block type polymers, which have anchor sites to the pigment surface, may be mentioned as preferable structures. On the other hand, a pigment derivative has an effect of promoting adsorption of polymeric dispersants by modifying the pigment surface.

Specific examples of the pigment dispersant include "DISPERBYK-101 (polyamideamine phosphate), 107 (carboxylic acid ester), 110 (copolymer containing acid groups), 130 (polyamide), 161, 162, 163, 164, 165, 166, 170 (high molecular copolymers)", "BYK-P104, P105 (high molecular weight unsaturated polycarboxylic acids)" (trade names, manufactured by BYK Chemie GmbH); "EFKA 4047, 4050, 4010, 4165 (polyurethane-based), EFKA 4330, 4340 (block copolymers), 4400, 4402 (modified polyacrylates), 5010 (polyester amide), 5765 (high molecular weight polycarboxylates), 6220 (fatty acid polyester), 6745 (phthalocyanine derivative), 6750 (azo pigment derivative)" (trade names, manufactured by EFKA GmbH & CO KG); "AJISPER PB821, PB822" (trade names, manufactured by Ajinomoto Fine-Techno Co., Inc.); "FLOWLEN TG-710 (urethane oligomers)" "POLYFLOW No. 50E, No. 300 (acrylic copolymers)" (trade names, Kyoeisha Chemical Co., Ltd.); "DISPARLON KS-860, 873SN, 874, #2150 (aliphatic polyvalent carboxylic acids), #7004 (polyether ester), DA-703-50, DA-705, DA-725" (trade names, manufactured by Kusumoto Chemicals, Ltd.); "DEMOL RN, N (naphthalenesulfonic acid-formalin polycondensates), MS, C, SN-B (aromatic sulfonic acid-formalin polycondensates)", "HOMOGENOL L-18 (high molecular polycarboxylic acid)", "EMULGEN 920, 930, 935, 985 (polyoxyethylene nonyl phenyl ethers)", "ACETAMIN 86 (stearylamine acetate)" (trade names, manufactured by Kao Corp.); "SOLSPERSE 5000 (phthalocyanine derivative), 22000 (azo pigment derivative), 13240 (polyester amine), 3000, 17000, 27000 (polymers having functional units at terminals), 24000, 28000, 32000, 38500 (graft type polymers)" (trade names, manufactured by Lubrizol Corp.); "NIKKOL T106 (polyoxyethylene sorbitan monooleate), MYS-IEX (polyoxyethylene monostearate)" (trade names, manufactured by Nikko Chemicals Co., Ltd.); and others.

These dispersants may be used singly, or may be used in combination of two or more kinds. According to the invention, it is preferable to use, in particular, a pigment derivative and a polymeric dispersant in combination.

The content of the dispersant in the curable composition is preferably 1 to 100% by mass, more preferably 3 to 100% by mass, and even more preferably 5 to 80% by mass, based on the pigment.

Specifically, in the case of using a polymeric dispersant, the amount of use thereof is preferably in the range of 5 to 100% by mass, and more preferably in the range of 10 to 80% by mass, based on the pigment. In the case of using a pigment derivative, the amount of use thereof is preferably in the range of 1 to 30% by mass, more preferably in the range of 3 to 20% by mass, and particularly preferably in the range of 5 to 15% by mass, based on the pigment.

In the case of using a pigment and a dispersant, the sum of contents of the pigment and the dispersant is preferably from 30% by mass to 90% by mass, more preferably from 40% by mass to 85% by mass, and even more preferably from 50% by mass to 80% by mass, relative to total solid content constituting the curable composition, from the viewpoint of curing sensitivity and color density.

<(G) Alkoxysilane Compound>

The curable composition of the invention preferably contains at least one (G) alkoxysilane compound from the viewpoint of further enhancing adhesiveness.

Particularly, when an inorganic base material is used as a support, and the curable composition of the invention is directly applied on the inorganic base material without providing an organic layer therebetween, it is preferable that the curable composition contain at least one of the (G) alkoxysilane compound, from the viewpoint of further enhancing adhesiveness.

The alkoxysilane compound according to the invention is not particularly limited, but from the viewpoint of obtaining the effects of the invention more effectively, an amino group-containing alkoxysilane compound having an amino group is preferred.

Furthermore, the alkoxysilane compound according to the invention is preferably an alkoxysilane compound represented by the following formula (I).

When the curable composition contains an alkoxysilane compound represented by the following formula (I), for example, high adhesiveness to inorganic materials may be obtained. Moreover, when the curable composition is in an unexposed state, development is achieved satisfactorily, and development residues may be suppressed.

(I)

In the formula (I), L represents a monovalent organic group; $R^1$ and $R^2$ each independently represent a hydrocarbon group; and n represents an integer from 1 to 3.

Examples of the monovalent organic group represented by L include an alkyl group having one or more carbon atoms which may be substituted, an alkenyl group, an aryl group, an alkoxy group, an amino group, and a group combining these groups. Among them, an alkyl group having 1 to 20 carbon atoms which may be substituted, is preferred.

Examples of the hydrocarbon group represented by $R^1$ and $R^2$ include a linear, branched or cyclic alkyl group (for example, a methyl group, an ethyl group, a propyl group, an isopropyl group, a butyl group, an isobutyl group, a pentyl group, a hexyl group, a cyclohexyl group, and a phenyl group). Among them, $R^1$ and $R^2$ are each preferably a linear, branched or cyclic alkyl group having 1 to 12 carbon atoms, more preferably a linear alkyl group having 1 to 6 carbon atoms, and particularly preferably a methyl group or an ethyl group.

n represents an integer from 1 to 3, and from the viewpoint of safety and adhesiveness, n is preferably 2 or 3.

The alkoxysilane compound represented by the formula (I) is preferably a compound having at least one hydrophilic moiety in the molecule, and is more preferably a compound having plural hydrophilic moieties. When plural hydrophilic moieties are present in the molecule, the hydrophilic moieties may be identical to or different from each other.

Among the alkoxysilane compounds represented by the formula (I), from the viewpoint of curability and from the viewpoint of removability in the case of removing the parts other than the cured areas through development or the like after curing, an alkoxysilane compound represented by the following formula (II) is preferred. That is, an alkoxysilane compound containing a hydrophilic moiety and having a monovalent organic group is preferred.

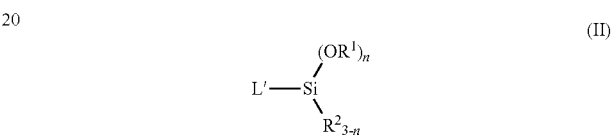

(II)

In the formula (II), L' represents a monovalent organic group containing a hydrophilic moiety.

$R^1$ and $R^2$ each independently represent a hydrocarbon group, and have the same definitions as $R^1$ and $R^2$ of the formula (I). The hydrocarbon group represented by $R^1$ and $R^2$ has the same details and preferable definitions as in the case of the formula (I).

Furthermore, n represents an integer from 1 to 3, and is preferably 2 or 3 from the viewpoint of safety and adhesiveness.

The "monovalent organic group containing a hydrophilic moiety" represented by L' will be explained below.

The "hydrophilic moiety" contained in the monovalent organic group L' represents an atomic group having polarity and high affinity with highly polar substances represented by water, and includes, for example, atoms of oxygen, nitrogen, sulfur, phosphorus and the like. Examples of such a hydrophilic moiety include moieties capable of dipole-dipole interaction, dipole-ion interaction, ionic bonding, hydrogen bonding or the like with a highly polar substance represented by water.

Examples of the hydrophilic moiety include a polar group or dissociable group containing an atom of oxygen, nitrogen, sulfur or the like, a hydrogen-bonding donor, a hydrogen-bonding acceptor, and a moiety having plural lone electron pairs which can gather and provide a hydrophilic field. Specific examples include a hydrophilic group such as a hydroxyl group, an amino group, a carbonyl group, a thiocarbonyl group, a mercapto group, a carbamoyl group, a carbamoyloxy group or a carbamoylamino group; a sulfonamide moiety, a urethane moiety, a thiourethane moiety, an amide moiety, an ester moiety, a thioether moiety, a urea moiety, a thiourea moiety, an oxycarbonyloxy moiety, an ammonium group, a secondary amine moiety, a tertiary amine moiety, a polyethyleneoxy moiety represented by $-(CH_2CH_2O)_a-$ (provided that a is an integer of 2 or more), an oxycarbonyloxy moiety, and partial structures (monovalent to trivalent hydrophilic moieties) represented by the following structural formulas.

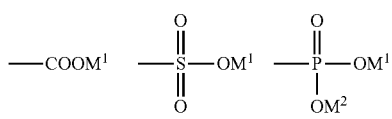

Monovalent hydrophilic moiety

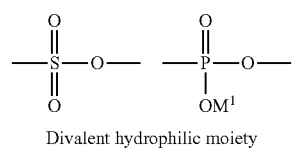

Divalent hydrophilic moiety

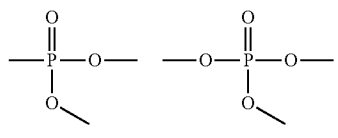

Trivalent hydrophilic moiety

In the above structural formulas, $M^1$ and $M^2$ each independently represent a hydrogen atom, or a monovalent metal atom (for example, lithium, sodium or potassium).

Among such hydrophilic moieties, a structure that does not cause a Michael addition reaction with the ethylenic double bonds of the polymerizable compounds (including the component (A) and the component (B)) is more preferred from the viewpoint of the stability over time of the curable composition. From such a standpoint, a hydroxyl group, a carbonyl group, a thiocarbonyl group, a carbamoyl group, a carbamoyloxy group, a carbamoylamino group, a urethane moiety, a thiourethane moiety, an amide moiety, an ester moiety, a thioether moiety, a urea moiety, a thiourea moiety, an oxycarbonyloxy moiety, an ammonium group, a tertiary amine moiety, a polyethyleneoxy moiety represented by —(CH$_2$CH$_2$O)$_a$— (provided that a is an integer of 2 or more), an oxycarbonyloxy moiety, and the partial structures represented by the above structural formulas (monovalent to trivalent hydrophilic moieties) are preferred.

Furthermore, when —Si(OR$^1$)$_n$R$^2_{3-n}$, which is a partial structure of the formula (II), is subjected to a hydrolysis reaction, the partial structure may cause an increase in the viscosity of the curable composition over time, or the like. From the viewpoint of being difficult to induce such a hydrolysis reaction, among the hydrophilic moieties, a hydroxyl group, a carbonyl group, a thiocarbonyl group, a urethane moiety, a thiourethane moiety, an amide moiety, an ester moiety, a thioether moiety, a carbamoyl group, a carbamoyloxy group, a carbamoylamino group, a urea moiety, a thiourea moiety, a tertiary amine moiety, and a polyethyleneoxy moiety are preferred, and a hydroxyl group, a urethane moiety, a thiourethane moiety, an amide moiety, a sulfonamide moiety, an ester moiety, a urea moiety, a thiourea moiety, a tertiary amine moiety, and a polyethyleneoxy moiety are more preferred. A hydroxyl group, a urethane moiety, a thiourethane moiety, a urea moiety, a tertiary amine moiety, and a polyethyleneoxy moiety represented by —(CH$_2$CH$_2$O)$_a$— (provided that a is an integer of 2 or more) are most preferred.

Among the alkoxysilane compounds described above, a more preferred compound is a compound represented by the following formula (III) or formula (IV).

<Alkoxysilane Compound Represented by Formula (III)>

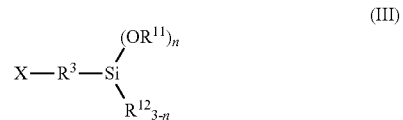

In the formula (III), $R^{11}$ and $R^{12}$ each independently represent a hydrocarbon group having 1 to 6 carbon atoms. The hydrocarbon group having 1 to 6 carbon atoms as represented by $R^{11}$ and $R^{12}$ may be a linear, branched or cyclic alkyl group having 1 to 6 carbon atoms (for example, a methyl group, an ethyl group, a propyl group, an isopropyl group, a butyl group, an isobutyl group, a pentyl group, a hexyl group, a cyclohexyl group, or a phenyl group), or the like. Among them, $R^{11}$ and $R^{12}$ are each preferably a methyl group or an ethyl group.

$R^3$ represents a divalent hydrocarbon group having 1 to 12 carbon atoms, and the hydrocarbon group may be unsubstituted or may be substituted. Furthermore, the hydrocarbon structure of the hydrocarbon groups may have a cyclic structure and/or an unsaturated bond. The hydrocarbon structure may also have a monovalent hydrophilic moiety. The hydrophilic moiety as used herein refers to those mentioned as the monovalent hydrophilic moiety among the groups described in connection with L', and preferable examples thereof are also similar.

The details of the divalent hydrocarbon group represented by $R^3$ will be described below.

X represents a monovalent hydrophilic moiety. The hydrophilic moiety as used herein refers to those mentioned as the monovalent hydrophilic moiety among the groups described in connection with L', and preferable examples thereof are also similar.

n represents an integer from 1 to 3, and is preferably 2 or 3 from the viewpoint of safety and adhesiveness.

<Alkoxysilane Compound Represented by Formula (IV)>

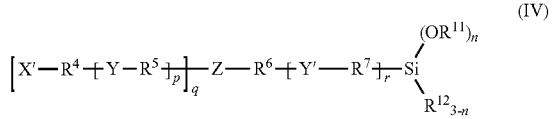

In the formula (IV), $R^{11}$ and $R^{12}$ each independently represent a hydrocarbon group having 1 to 6 carbon atoms. The hydrocarbon group having 1 to 6 carbon atoms represented by $R^{11}$ and $R^{12}$ may be a linear, branched or cyclic alkyl group having 1 to 6 carbon atoms (for example, a methyl group, an ethyl group, a propyl group, an isopropyl group, a butyl group, an isobutyl group, a pentyl group, a hexyl group, a cyclohexyl group or a phenyl group), or the like. Among them, $R^{11}$ and $R^{12}$ are each preferably a methyl group or an ethyl group.

$R^4$, $R^5$, $R^6$ and $R^7$ each independently represent a single bond, or a hydrocarbon chain (divalent hydrocarbon group) having 1 to 12 carbon atoms which may be unsubstituted or substituted. However, when $R^4$, $R^5$, $R^6$ and $R^7$ each represent a hydrocarbon chain (divalent hydrocarbon group), the hydrocarbon chain may have a cyclic structure and/or an unsaturated bond in the hydrocarbon structure. Furthermore, the hydrocarbon chain (divalent hydrocarbon group) may have a monovalent hydrophilic moiety as a substituent.

The details of the divalent hydrocarbon group represented by $R^4$ to $R^7$ will be described below.

X' represents a hydrogen atom, or a monovalent substituent, and the monovalent substituent may contain a hydrophilic moiety. The hydrophilic moiety as used herein refers to those mentioned as the monovalent hydrophilic moiety among the groups described in connection with L', and preferable examples thereof are also similar.

Y and Y' each independently represent a divalent hydrophilic moiety; Z represents a divalent or trivalent hydrophilic moiety which corresponds to the value of q; and q is 1 or 2. That is, when q is 1, Z represents a divalent hydrophilic moiety, and when q is 2, Z represents a trivalent hydrophilic moiety. The divalent or trivalent hydrophilic moiety has the same definition as those exemplified as the divalent or trivalent hydrophilic moiety among the hydrophilic moieties described in connection with the formula (I) or formula (II).

p represents an integer from 0 to 20, and r represents an integer from 0 to 3. n represents an integer from 1 to 3.

When $R^3$ in the formula (III), or $R^4$, $R^5$, $R^6$ or $R^7$ in the formula (IV) is a divalent hydrocarbon group, an alkyl group containing a linear, branched or cyclic structure, or an aromatic cyclic group is preferable, and these groups may have substituents.

Examples of the substituents that may be introduced into this divalent hydrocarbon group include an aliphatic group, an aromatic group, a heterocyclic group, a halogen atom, a cyano group, a nitro group, an aliphatic oxy group, an aromatic oxy group, a heterocyclic oxy group, and a hydrophilic group, and among them, an aliphatic group having 1 to 12 carbon atoms, an aromatic group, a heterocyclic group, a chlorine atom, a cyano group and a hydrophilic group are preferred.

Preferable examples of the aliphatic group having 1 to 12 carbon atoms include a methyl group, an ethyl group, a propyl group, an isopropyl group, a butyl group, an isobutyl group, a pentyl group, a hexyl group, a cyclohexyl group, and an octyl group, and among them, a methyl group, an ethyl group, and a propyl group are preferred.

Examples of the aromatic group include a phenyl group, a naphthyl group, and an anthracene group, and a phenyl group is preferred.

Examples of the heterocyclic group include a morpholino group, a tetrahydrofurfuryl group, a pyrrolyl group, a furyl group, a thiophenyl group, a benzopyrrolyl group, a benzofuryl group, a benzothiophenyl group, a pyrazolyl group, an isoxazolyl group, an isothiazolyl group, an indazolyl group, a benzisoxazolyl group, a benzisothiazolyl group, an imidazolyl group, an oxazolyl group, a thiazolyl group, a benzimidazolyl group, a benzoxazolyl group, a benzothiazolyl group, a pyridyl group, a quinolinyl group, an isoquinolinyl group, a pyridazinyl group, a pyrimidinyl group, a pyrazinyl group, a cinnolinyl group, a phthalazinyl group, a quinazolinyl group, a quinoxalinyl group, an acridinyl group, a phenanthridinyl group, a phthalazinyl group, a carbazolyl group, a carbolinyl group, a purinyl group, a triazolyl group, an oxadiazolyl group, and a thiadiazolyl group. A morpholino group, a tetrahydrofurfuryl group and a pyridyl group are preferred.

Examples of the hydrophilic group include a hydroxyl group, an amino group, a carbonyl group, a thiocarbonyl group, a mercapto group, a carbamoyl group, a carbamoyloxy group, and a carbamoylamino group. A hydroxyl group, a carbonyl group and an amino group are preferred.

When $R^3$ in the formula (III) or $R^4$, $R^5$, $R^6$ or $R^7$ in the formula (IV) is a divalent hydrocarbon group, examples of the "monovalent hydrophilic moiety" which may be carried the divalent hydrocarbon group include a hydroxyl group, an amino group, a mercapto group, an ammonium group, a carbamoyl group, a carbamoyloxy group, a carbamoylamino group, and partial structural moieties represented by the following structural formulas ($M^1$ and $M^2$ have the same definitions as described above).

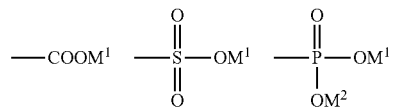

Among those mentioned above, the "divalent hydrocarbon group" represented by $R^3$ in the formula (III) is preferably a methylene chain having 1 to 5 carbon atoms, or a methylene chain (more preferably a methylene chain having 3 carbon atoms) which may be substituted and may also contain an oxygen atom in the chain.

The "divalent hydrocarbon group" represented by $R^4$ to $R^7$ in the formula (IV) is preferably a methylene chain having 1 to 5 carbon atoms, or a methylene chain (more preferably, a methylene chain having 3 carbon atoms) which may be substituted and may also contain an oxygen atom in the chain.

Preferable examples of the monovalent hydrophilic moiety in X in the formula (III) or X' in the formula (IV) include a hydroxyl group, an amino group, a mercapto group, an ammonium group, a carbamoyl group, a carbamoyloxy group, a carbamoylamino group, and partial structural moieties represented by the following structural formulas ($M^1$ and $M^2$ have the same definitions as described above).

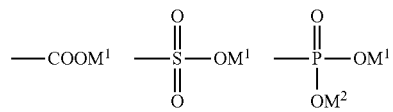

In the formula (IV), when Y, Y' and Z are each a divalent hydrophilic moiety, preferable examples thereof include a carbonyl group, a thiocarbonyl group, a urethane moiety, a thiourethane moiety, an amide moiety, an ester moiety, a thioether moiety, a sulfonamide moiety, a urea moiety, a thiourea moiety, a secondary amine moiety, a polyethyleneoxy moiety represented by —(CH$_2$CH$_2$O)$_a$— (provided that a is an integer of 2 or more), an oxycarbonyloxy moiety, and partial structural moieties represented by the following structural formulas ($M^1$ is as described above).

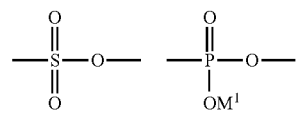

In the formula (IV), when Z is a trivalent hydrophilic moiety, preferable examples thereof include a tertiary amine moiety, a urea moiety, a thiourea moiety, and partial structures represented by the following structural formulas.

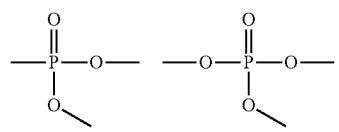

Among the compounds represented by the formula (III), preferably, a compound in which $R^{11}$ and $R^{12}$ each represent a methyl group or an ethyl group; $R^3$ represents a methylene chain having 1 to 5 carbon atoms, or a methylene chain (more preferably, a methylene chain having 3 carbon atoms) which may be substituted and may contain an oxygen atom in the chain; X represents an amino group; and n is 2 or 3 (more preferably, 2), is more preferred.

Furthermore, among the compounds represented by the formula (IV), preferably, a compound in which $R^{11}$ and $R^{12}$ each represent a methyl group or an ethyl group; $R^4$ and $R^5$ each represent a methylene chain having 1 to 5 carbon atoms (more preferably, a methylene chain having 2 carbon atoms); $R^6$ and $R^7$ each represent a methylene chain having 1 to 5 carbon atoms (more preferably, a methylene chain having 3 carbon atoms); X' represents an amino group; Y, Y' and Z each represent an amino group; p is 0; q is 1; r is 0; and n is 2 or 3 (more preferably, 2), is more preferred.

Specific examples of the alkoxysilane compounds represented by the formulas (I) to (IV) will be presented below. However, the invention is not intended to be limited to these.

Examples of the alkoxysilane compound represented by the formula (I) include β-(3,4-epoxycyclohexyl)ethyltrimethoxysilane, γ-glycidoxypropyltrimethoxysilane, γ-glycidoxypropyltriethoxysilane, methyltrimethoxysilane, methyltriethoxysilane, vinyltriacetoxysilane, γ-chloropropyltrimethoxysilane, vinyltrimethoxysilane, vinyltriethoxysilane, γ-chloropropylmethyldimethoxysilane, trimethylchlorosilane, 2-(3,4-epoxycyclohexyl)ethyltrimethoxysilane, bisallyltrimethoxysilane, tetraethoxysilane, bis(trimethoxysilyl)hexane, and phenyltrimethoxysilane.

Specific examples of the alkoxysilane compound represented by the formulas (II), (III) or (IV) [example compounds (1) to (145)], which are more preferred forms, are presented below.

(1)
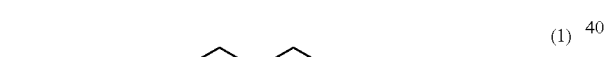

(2)
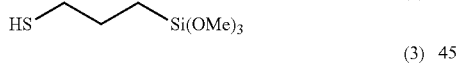

(3)
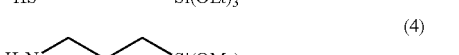

(4)
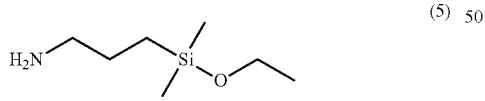

(5)
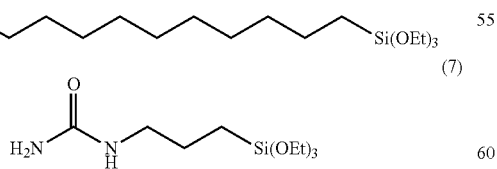

(6)
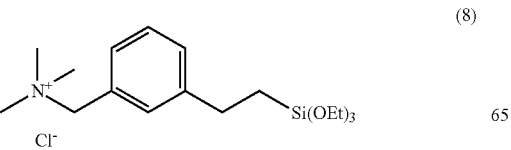

(7)
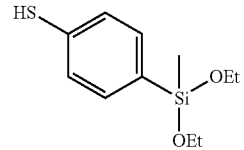

(8)
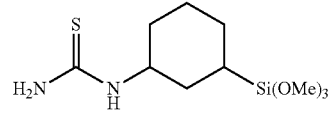

(9)
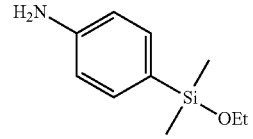

(10)
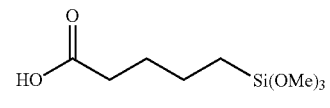

(11)
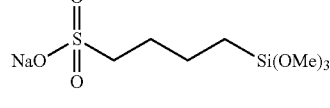

(12)
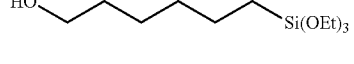

(13)
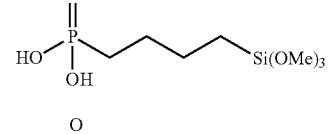

(14)
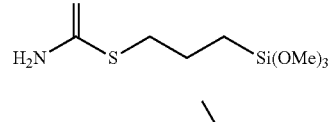

(15)
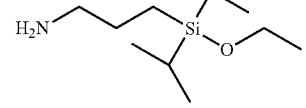

(16)
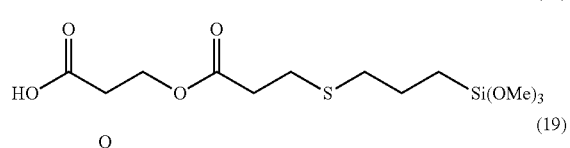

(17)
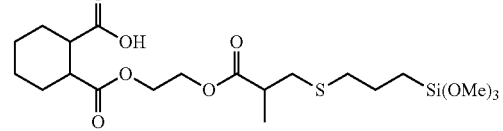

(18)

(19)

(20)
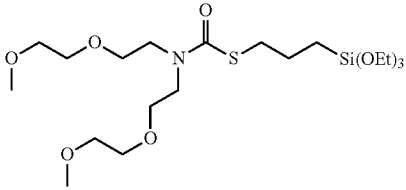

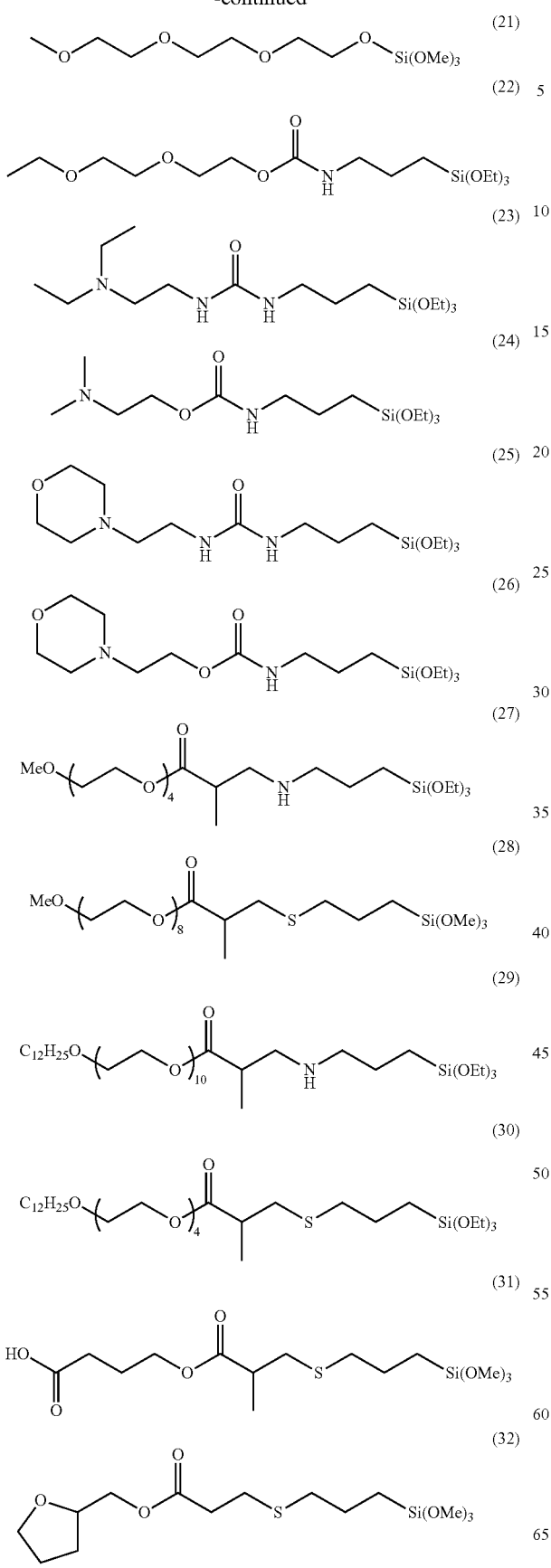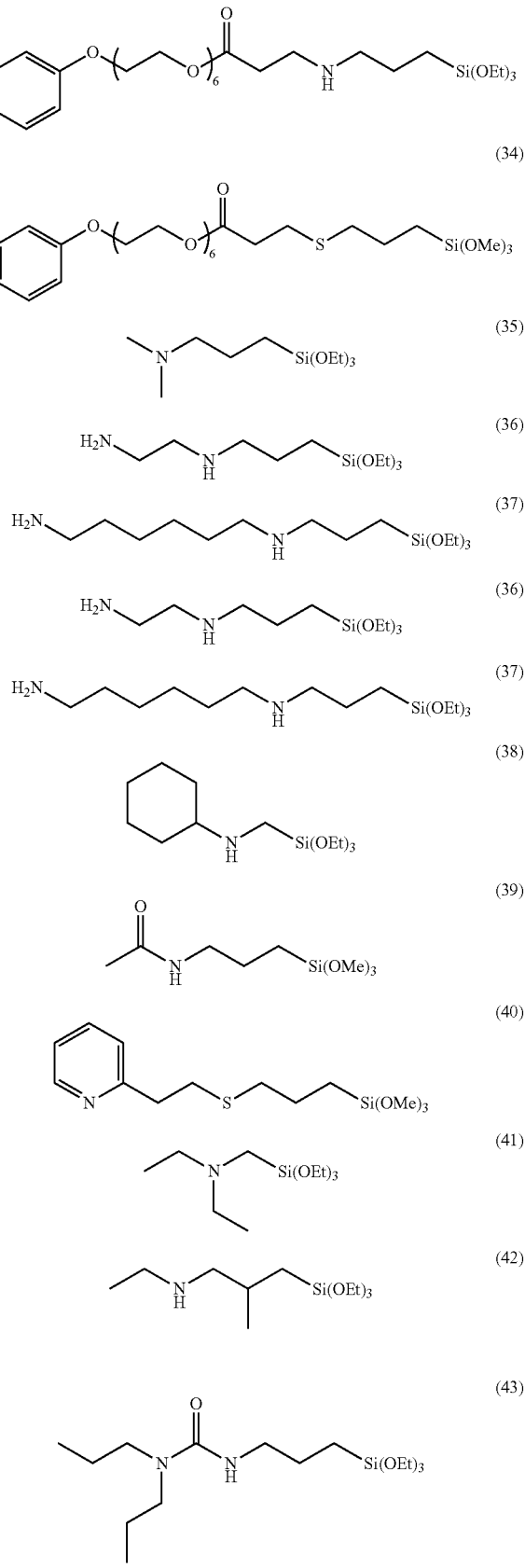

(44) 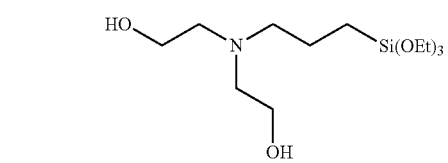
(45) 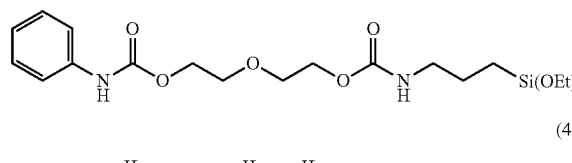
(46) 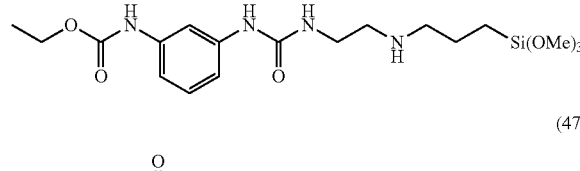
(47) 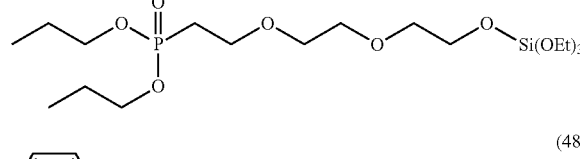
(48) 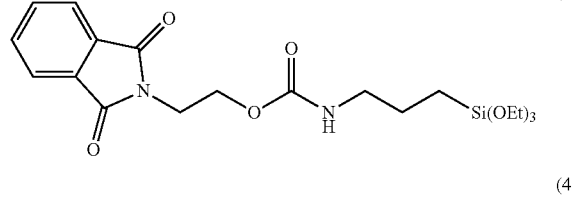
(49) 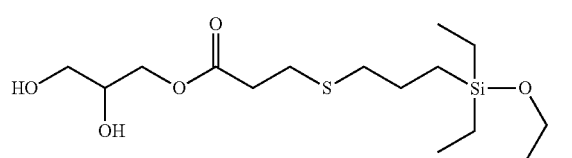
(50) 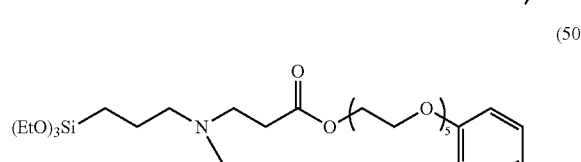
(51) 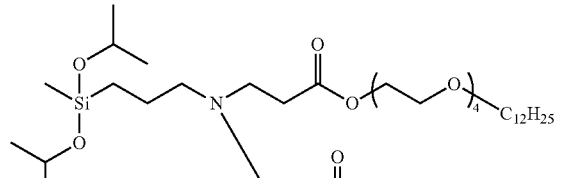
(52) 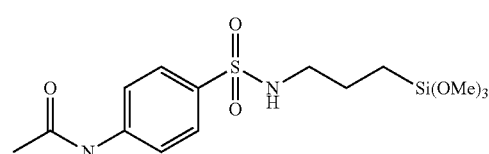
(54) 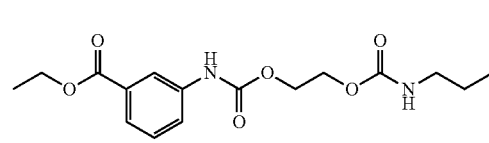
(55) 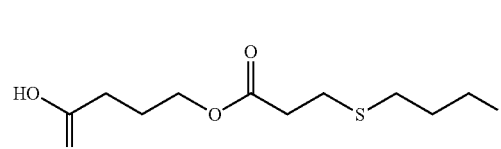
(56) 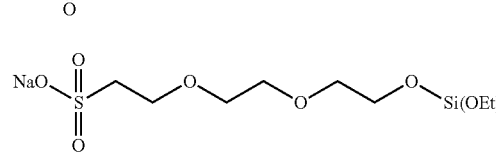
(57) 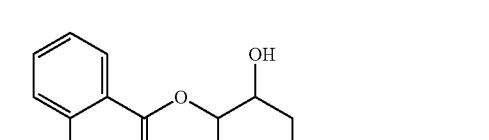
(58) 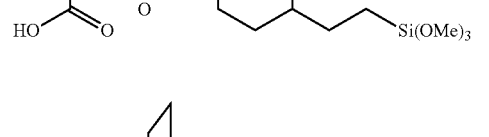
(59) 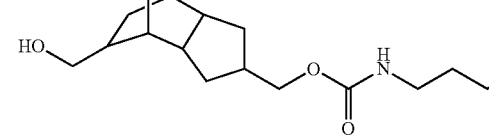
(60) 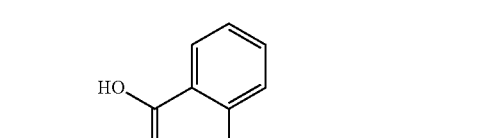
(61) 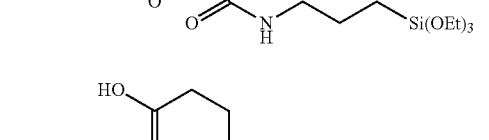

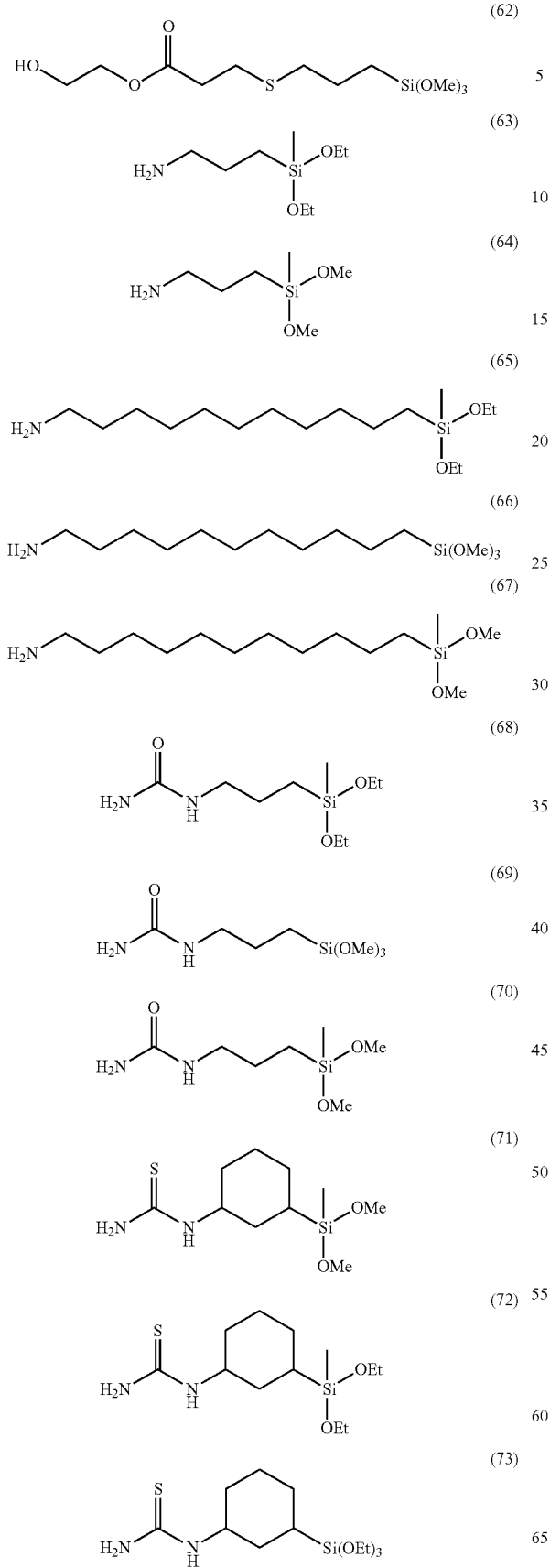
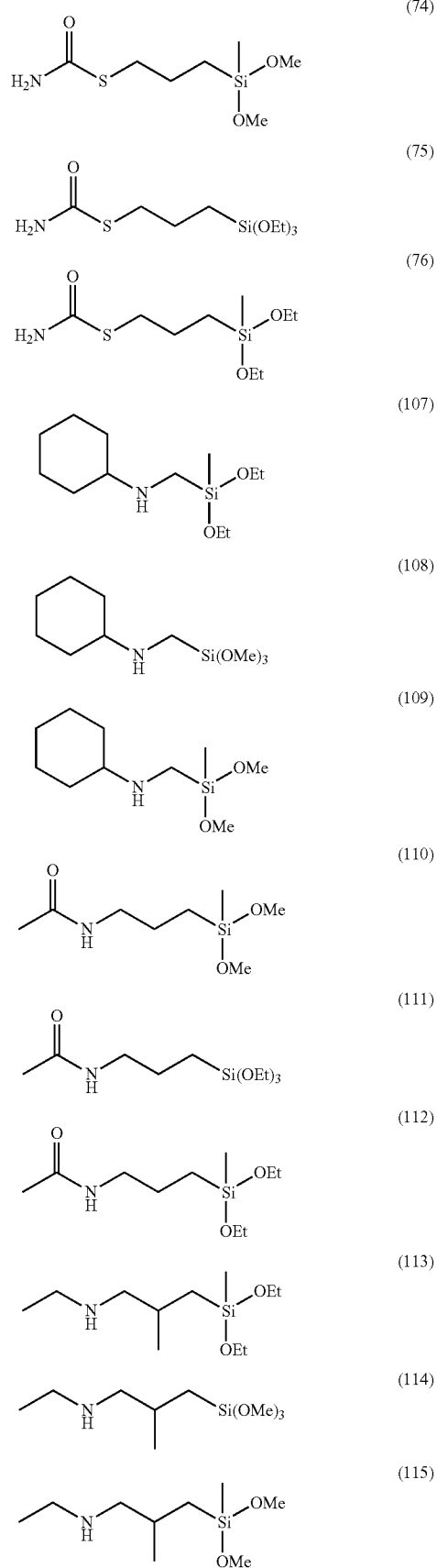

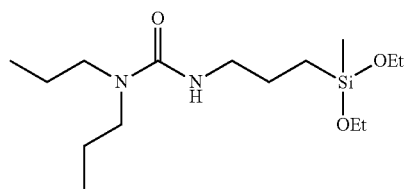
(116)
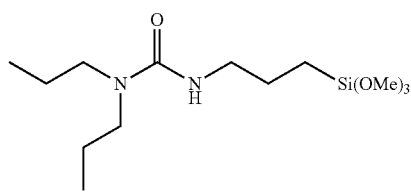
(117)
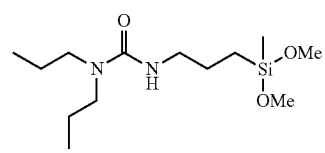
(118)
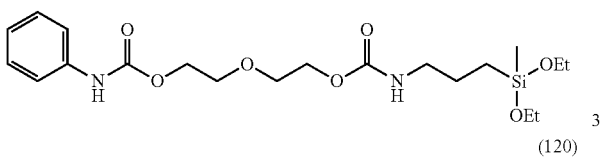
(119)
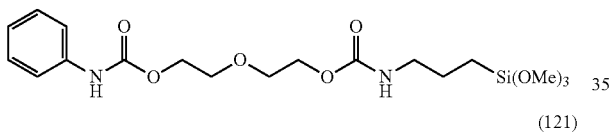
(120)
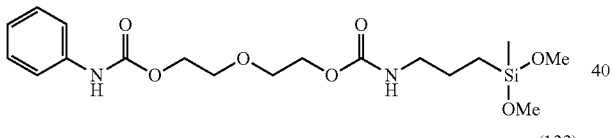
(121)
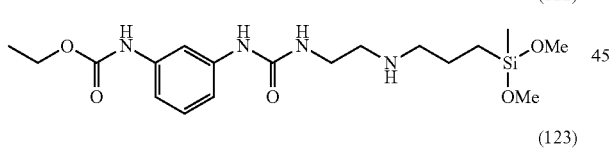
(122)
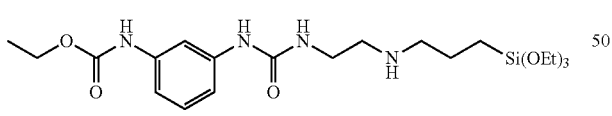
(123)
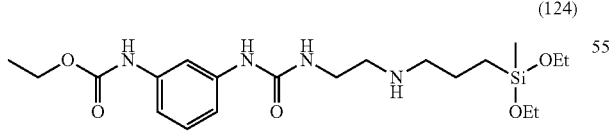
(124)
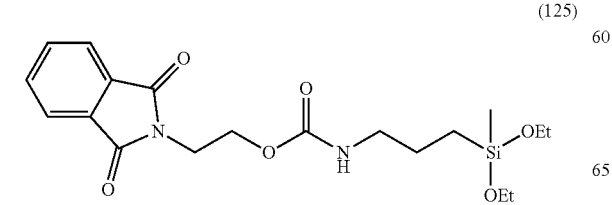
(125)

-continued (135)
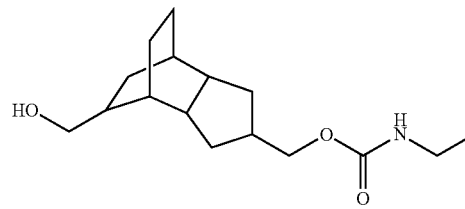

(136)
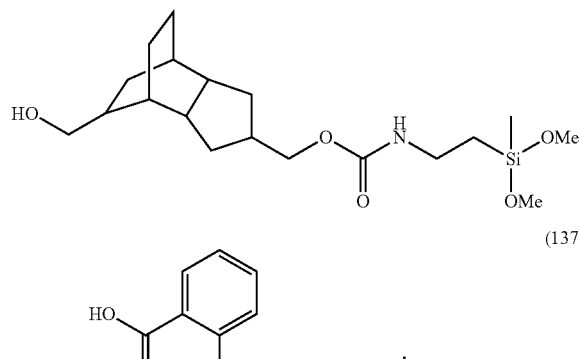

(137)

(138)

(139)
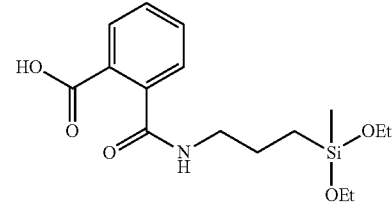
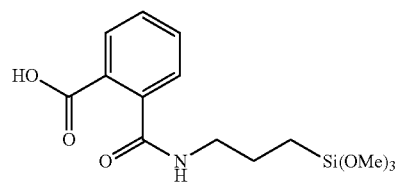
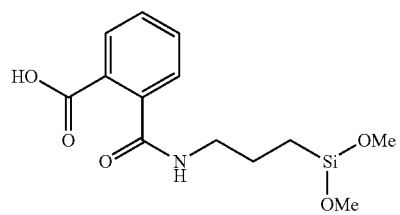

(140)

(141)

(142)
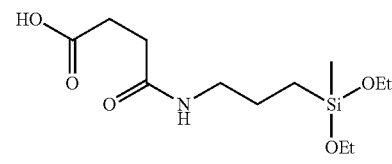
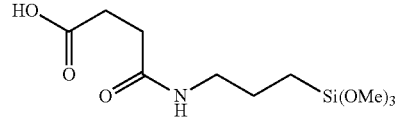
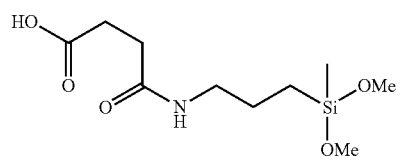

-continued (143)
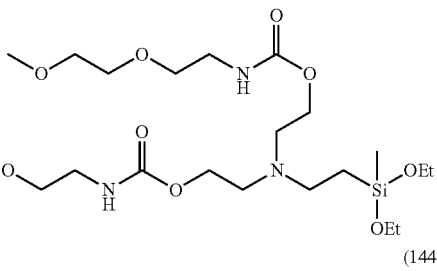

(144)
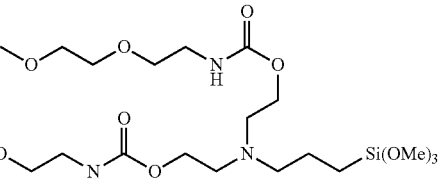

(145)
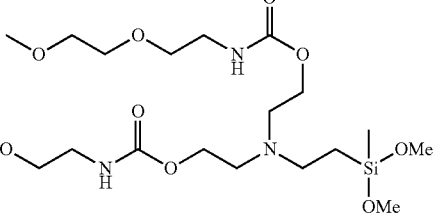

The total content of the alkoxysilane compounds explained above is, from the viewpoint of more effectively achieving a balance between the reduction of development residues and the enhancement of adhesiveness, preferably from 0.1% by mass to 10.0% by mass, more preferably from 0.1% by mass to 8.0% by mass, and particularly preferably from 0.1% by mass to 6.0% by mass, relative to total solid content of the curable composition of the invention.

<Solvent>

The curable composition of the invention preferably contains at least one solvent.

Preferable examples of the solvent that may be used when the curable composition of the invention is prepared, include esters, for example, ethyl acetate, n-butyl acetate, isobutyl acetate, amyl formate, isoamyl acetate, isobutyl acetate, butyl propionate, isopropyl butyrate, ethyl butyrate, butyl butyrate, alkyl esters, methyl lactate, ethyl lactate, methyl oxyacetate, ethyl oxyacetate, butyl oxyacetate, methyl methoxyacetate, ethyl methoxyacetate, butyl methoxyacetate, methyl ethoxyacetate, and ethyl ethoxyacetate;

3-oxypropionic acid alkyl esters such as methyl 3-oxypropionate, and ethyl 3-oxypropionate (for example, methyl 3-methoxypropionate, ethyl 3-methoxypropionate, methyl 3-ethoxypropionate, and ethyl 3-ethoxypropionate), 2-oxypropionic acid alkyl esters such as methyl 2-oxypropionate, ethyl 2-oxypropionate, and propyl 2-oxypropionate (for example, methyl 2-methoxypropionate, ethyl 2-methoxypropionate, propyl 2-methoxypropionate, methyl 2-ethoxypropionate, ethyl 2-ethoxypropionate, methyl 2-oxy-2-methylpropionate, ethyl 2-oxy-2-methylpropionate, methyl 2-methoxy-2-methylpropionate, and ethyl 2-ethoxy-2-methylpropionate);

methyl pyruvate, ethyl pyruvate, propyl pyruvate, methyl acetoacetate, ethyl acetoacetate, methyl 2-oxobutanoate, ethyl 2-oxobutanoate, and the like;

ethers, for example, diethylene glycol dimethyl ether, tetrahydrofuran, ethylene glycol monomethyl ether, ethylene glycol monoethyl ether, methylcellosolve acetate, ethylcellosolve acetate, ethylcarbitol acetate, butylcarbitol acetate, diethylene glycol monomethyl ether, diethylene glycol monoethyl ether, and diethylene glycol monobutyl ether, propylene glycol monomethyl ether, propylene glycol monomethyl ether acetate, propylene glycol monoethyl ether acetate, and propylene glycol monopropyl ether acetate; ketones, for example, methyl ethyl ketone, cyclohexanone, cyclopentanone, 2-heptanone, and 3-heptanone; and aromatic hydrocarbons, for example, toluene and xylene.

Among these, methyl 3-ethoxypropionate, ethyl 3-ethoxypropionate, ethylcellosolve acetate, ethyl lactate, diethylene glycol dimethyl ether, butyl acetate, methyl 3-methoxypropionate, 2-heptanone, cyclohexanone, cyclopentanone, ethylcarbitol acetate, butylcarbitol acetate, propylene glycol monomethyl ether, propylene glycol monomethyl ether acetate, and the like are more preferred. Among them, ethyl lactate, ethyl 3-ethoxypropionate, cyclohexanone, cyclopentanone, and propylene glycol monomethyl ether acetate are most preferred.

Furthermore, when the curable composition of the invention contains the alkoxysilane compound, the solvent according to the invention is preferably a ketone from the viewpoint of the compatibility with the alkoxysilane compound. The solvent is more preferably a cyclic ketone, and particularly preferably cyclohexanone or cyclopentanone.

<Other Components>

The curable composition of the invention may contain other components in addition to those mentioned above.

(Sensitizer)

The curable composition of the invention may contain a sensitizer.

The sensitizer is preferably a compound that sensitizes the photopolymerization initiator through an electron transfer mechanism or an energy transfer mechanism.

The sensitizer may be a compound which belongs to the compound classes listed below and has an absorption wavelength in the wavelength region of 300 nm to 450 nm.

That is, examples include polynuclear aromatics (for example, phenanthrene, anthracene, pyrene, perylene, triphenylene, and 9,10-dialkoxyanthracene), xanthenes (for example, fluorescein, eosin, erythrosine, rhodamine B, and Rose Bengal), thioxanthenes (isopropylthioxanthone, diethylthioxanthone, and chlorothioxanthone), cyanines (for example, thiacarbocyanine, and oxacarbocyanine), merocyanines (for example, merocyanine, and carbomerocyanine), phthalocyanines, thiazines (for example, thionine, methylene blue, and toluidine blue), acridines (for example, acridine orange, chloroflavin, and acriflavin), anthraquinones (for example, anthraquinone), squaryliums (for example, squarylium), acridine orange, coumarins (for example, 7-diethylamino-4-methylcoumarin), ketocoumarin, phenothiazines, phenazines, styrylbenzenes, azo compounds, diphenylmethane, triphenylmethane, distyrylbenzenes, carbazoles, porphyrin, spiro compounds, quinacridone, indigo, styryl, pyrylium compounds, pyrromethene compounds, pyrazolotriazole compounds, benzothiazole compounds, barbituric acid derivatives, thiobarbituric acid derivatives, aromatic ketone compounds such as acetophenone, benzophenone, thioxanthone and Michler's ketone, and heterocyclic compounds such as N-aryloxazolidinone.

When the curable composition of the invention contains a sensitizer, the content of the sensitizer in the curable composition is, in terms of solids content, preferably 0.1 to 20% by mass, and more preferably 0.5 to 15% by mass, from the viewpoint of the efficiency of light absorption into deeper parts and the initiation decomposition efficiency.

(Co-Sensitizer)

The curable composition of the invention may contain a co-sensitizer.

The co-sensitizer has an effect of further enhancing the sensitivity of the photopolymerization initiator or the sensitizer to active radiation, or of suppressing the inhibition of polymerization of photopolymerizable compounds by oxygen.

Examples of such a co-sensitizer include amines, for example, the compounds described in M. R. Sander et al., "Journal of Polymer Society", Vol. 10, p. 3173 (1972), JP-B-44-20189, JP-A-51-82102, JP-A-52-134692, JP-A-59-138205, JP-A-60-84305, JP-A-62-18537, JP-A-64-33104, and Research Disclosure, No. 33825. Specific examples thereof include triethanolamine, p-dimethylaminobenzoic acid ethyl ester, p-formyldimethylaniline, and p-methylthiodimethylaniline.

Other examples of the co-sensitizer include thiols and sulfides, for example, the thiol compounds described in JP-A-53-702, JP-B-55-500806, and JP-A-5-142772, and the disulfide compounds described in JP-A-56-75643. Specific examples thereof include 2-mercaptobenzothiazole, 2-mercaptobenzoxazole, 2-mercaptobenzimidazole, 2-mercapto-4 (3H)-quinazoline, and β-mercaptonaphthalene.

Still other examples of the co-sensitizer include amino acid compounds (for example, N-phenylglycine), the organometallic compounds described in JP-B-48-42965 (for example, tributyltin acetate), the hydrogen donors described in JP-B-55-34414, and the sulfur compounds described in JP-A-6-308727 (for example, trithiane).

When the curable composition of the invention contains a co-sensitizer, the content of the co-sensitizer is preferably in the range of 0.1 to 30% by mass, more preferably in the range of 1 to 25% by mass, and even more preferably in the range of 0.5 to 20% by mass, relative to the mass of total solid content of the curable composition, from the viewpoint of enhancing the rate of curing as a result of a balance between the polymerization growth rate and the chain transfer.

(Thermal Polymerization Preventing Agent)

In the curable composition of the invention, a small amount of a thermal polymerization preventing agent may be added in order to inhibit unnecessary thermal polymerization of photopolymerizable compounds during the preparation or storage of the composition.

Examples of the thermal polymerization preventing agent that may be used in the invention include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), and N-nitrosophenylhydroxyamine primary cerium(III) salt.

When the curable composition of the invention contains a thermal polymerization preventing agent, the amount of addition of the thermal polymerization preventing agent is preferably about 0.01 to about 5% by mass relative to total solid content of the curable composition.

Furthermore, if necessary, a higher fatty acid derivative such as behenic acid or behenic acid amide may be added and distributed only at the surface of the coating film in the course of drying after coating, in order to prevent the inhibition of polymerization by oxygen. The amount of addition of the higher fatty acid derivative is preferably about 0.5 to about 10% by mass of the total amount of the composition.

(Adhesion Enhancing Agent)

In the curable composition of the invention, a known adhesion enhancing agent may be used together with the alkoxysilane compound mentioned above.

Examples of the known adhesion enhancing agent include a silane-based coupling agent, and a titanium coupling agent.

Examples of the silane-based coupling agent include γ-(2-aminoethyl)aminopropyltrimethoxysilane, γ-(2-aminoethyl)aminopropyldimethoxysilane, β-(3,4-epoxycyclohexyl)ethyltrimethoxysilane, γ-aminopropyltrimethoxysilane, γ-aminopropyltriethoxysilane, γ-methacryloxypropyltrimethoxysilane, γ-methacryloxypropyltriethoxysilane, γ-acryloxypropyltrimethoxysilane, γ-acryloxypropyltriethoxysilane, γ-isocyanatopropyltrimethoxysilane, γ-isocyanatopropyltriethoxysilane, N-β-(N-vinylbenzylaminoethyl)-γ-aminopropyltrimethoxysilane.hydrochloride, γ-glycidoxypropyltrimethoxysilane, γ-glycidoxypropyltriethoxysilane, aminosilane, γ-mercaptopropyltrimethoxysilane, γ-mercaptopropyltriethoxysilane, methyltrimethoxysilane, methyltriethoxysilane, vinyltriacetoxysilane, γ-chloropropyltrimethoxysilane, hexamethyldisilazane, γ-anilinopropyltrimethoxysilane, vinyltrimethoxysilane, vinyltriethoxysilane, vinyltris(β-methoxyethoxy)silane, octadecyldimethyl[3-(trimethoxysilyl)propyl]ammonium chloride, γ-chloropropylmethyldimethoxysilane, γ-mercaptopropylmethyldimethoxysilane, methyltrichlorosilane, dimethyldichlorosilane, trimethylchlorosilane, 2-(3,4-epoxycyclohexyl)ethyltrimethoxysilane, bisallyltrimethoxysilane, tetraethoxysilane, bis(trimethoxysilyl)hexane, phenyltrimethoxysilane, N-(3-acryloxy-2-hydroxypropyl)-3-aminopropyltriethoxysilane, N-(3-methacryloxy-2-hydroxypropyl)-3-aminopropyltriethoxysilane, (methacryloxymethyl)methyldiethoxysilane, and (acryloxymethyl)methyldimethoxysilane.

Among them, γ-methacryloxypropyltrimethoxysilane, γ-methacryloxypropyltriethoxysilane, γ-acryloxypropyltrimethoxysilane, γ-acryloxypropyltriethoxysilane, γ-mercaptopropyltrimethoxysilane, γ-aminopropyltriethoxysilane, and phenyltrimethoxysilane are preferred, and γ-methacryloxypropyltrimethoxysilane is most preferred.

(Other Additives)

Furthermore, the curable composition of the invention may contain known additives such as an inorganic filler, a plasticizer and a sensitizing agent, so as to improve the properties of the cured coating film.

Examples of the plasticizer include dioctyl phthalate, didodecyl phthalate, triethylene glycol dicaprylate, dimethyl glycol phthalate, tricresyl phosphate, dioctyl adipate, dibutyl sebacate, and triacetylglycerin. When a binding agent is used, the plasticizer may be added in an amount of 10% by mass or less relative to the total mass of the photopolymerizable compounds and resins.

<<Color Filter>>

The color filter of the invention is formed using the curable composition of the invention, and is constituted to have, for example, on a support that will be described below, colored patterns of one or more colors (preferably, 3 colors or 4 colors) formed by using the curable composition of the invention as described above.

In the color filter of the invention, the adhesiveness between the support and the colored patterns is excellent, and development residues are reduced.

The color filter of the invention may be a color filter for liquid crystal display apparatuses, or a color filter for solid-state imaging devices; however, from the viewpoint of obtaining the effects of adhesiveness enhancement and the effects of development residue reduction more effectively, the color filter is preferably a color filter for solid-state imaging devices.

The size (line width) of the colored pattern (colored pixel) that constitute the color filter of the invention is preferably 2.0 μm or less, and particularly preferably 1.7 μm or less, from the viewpoint of obtaining the effects of adhesiveness enhancement and the effects of development residue reduction more effectively.

The thickness of the colored pattern is preferably 0.1 to 2.0 μm, and more preferably 0.2 to 1.0 μm, from the viewpoint of obtaining the effects of adhesiveness enhancement and the effects of development residue reduction more effectively.

In the color filter for solid-state imaging devices, generally, a colored pattern is formed, with an organic film as an undercoat layer (hereinafter, also referred to as "organic undercoat film") disposed between the inorganic base material and the colored pattern, for the purpose of improving the adhesiveness of the colored pattern or the like.

However, in recent years, there is a demand for a technology of forming a colored pattern directly on an inorganic base material without providing an organic undercoat film therebetween, from the viewpoint of shortening of processes, reduction of material cost, thickness reduction of color filters, and the like. In the case of forming a colored pattern directly on an inorganic base material without providing an organic undercoat film therebetween, the adhesiveness of the colored pattern is deteriorated.

From this point of view, the color filter of the invention which has excellent adhesiveness and produces less development residues, is particularly suitable as a color filter that is directly formed on an inorganic base material without an organic undercoat film provided therebetween.

Furthermore, the color filter of the invention preferably includes a colored pattern of the Bayer array (hereinafter, also referred to as "Bayer pattern"), from the viewpoint of obtaining the effects of adhesiveness enhancement and the effects of development residue reduction more effectively.

According to the invention, the Bayer array refers to an array in which multiple squares are arranged in a checkered pattern. The Bayer array is applied to, for example, the array of green pixels in a color filter for solid-state imaging devices.

<<Method for Producing Color Filter>>

The method for producing the color filter of the invention is not particularly limited, but a suitable example is a method for production of a color filter including the steps of applying the curable composition of the invention described above on a support, subsequently exposing the coating film thus applied and formed through a mask, and forming a colored pattern through development. When a color filter having three colors or four colors is to be produced, the color filter may be produced by repeating the steps described above for each and every color, and thereby forming a pattern for each color.

Hereinafter, a more specific example of the method for producing a color filter will be explained.

That is, there may be mentioned a production method constituted to include an application step of applying the curable composition of the invention on a support (if necessary, further including a prebake step of prebaking the applied curable composition); an exposure step of patternwise exposing the applied curable composition through a mask; and a development step of alkali-developing the patternwise exposed curable composition (if necessary, further including a post-bake step of post-baking the alkali-developed curable composition).

More specifically, for example, in the application step, the curable composition of the invention is applied on an appropriate support by a spinner or the like, so as to obtain a film thickness upon drying of generally 0.1 to 5 µm, and preferably 0.2 to 2 µm, and thereby a smooth coating film is obtained.

After the curable composition has been applied, prebaking is usually carried out so as to evaporate the solvent and to obtain a dry coating film (prebake step). Examples of this method of prebaking include indirect heating and drying by means of hot air or the like, and direct heating and drying by means of a hot plate or the like (about 80 to 140° C., 50 to 200 seconds). Prior to the prebaking, drying under reduced pressure may be carried out.

Furthermore, post-baking is carried out in order to sufficiently cure the pattern obtained after development, to increase thereby the mechanical strength and to obtain a permanent film (post-bake step). For example, upon the production of a color filter of three colors, the pattern that is initially formed undergoes the application of a resist liquid of another color, exposure and development two times. In this instance, post-baking is carried out in order to prevent color mixing with other applied resist liquids, and loss of pattern due to exposure and development. This post-baking is carried out using the same method as in the case of prebaking, but under the conditions of higher temperature and longer time than the conditions for prebaking. For example, in the case of indirect heating by means of an oven, the process is carried out at about 180 to 250° C. for about 0.5 to 2 hours, and in the case of direct heating by means of a hot plate, the process is carried out at about 180 to 250° C. for about 2 to 10 minutes.

The light source for pattern exposure in the exposure step is not particularly limited, but as a light source that brings about conspicuous effects in connection with the pattern forming properties, a light having a wavelength of 410 nm or less is preferred, and among others, the i-line (365 nm) of a mercury lamp is particularly preferred.

The developer liquid used in the development of the curable composition is not particularly limited, and conventionally known developer liquids may be used. Among them, organic alkali-based developer liquids of quaternary ammonium salts such as tetramethylammonium hydroxide (TMAH) are preferable for achieving the purpose of the invention.

As the support, both inorganic base materials and organic base materials may be used, but from the viewpoint of obtaining the effects of adhesiveness enhancement more effectively, an inorganic base material is preferred. The details of the inorganic base material will be described below.

Specific examples of the support include a glass substrate, a plastic substrate, an aluminum substrate, a base material of electronic elements such as silicon wafer for solid-state imaging devices, a transparent resin substrate, a resin film, a cathode ray tube-based display plane, a light-receiving surface of imaging sensors, and a semiconductor wafer on which a solid-state imaging device (such as CCD, CMOS, BBD, CID or BASIS) has been formed. Furthermore, contact image sensors using thin film semiconductors, liquid crystal display planes, photoreceptors for color electrophotography, and electrochromic (EC) display apparatuses may also be used.

It is also preferable to subject the support to an adhesion treatment, so as to enhance the adhesiveness to the color filter (colored pattern). The effects induced by this adhesion treatment are particularly effective when the support is an inorganic base material, and a colored pattern (color filter) is formed directly on the inorganic base material without an organic undercoat layer provided therebetween, as described above.

The adhesion treatment process adopted in the case of applying an adhesion aid on an inorganic base material as a support, will be explained below.

—Adhesion Treatment Process—

In the adhesion treatment process, an adhesion aid is applied on the inorganic base material. Application of the adhesion aid may be carried out by methods such as coating, inkjet application, printing and deposition.

In the case of performing coating, various known coating methods such as slit coating, rotary coating, flow cast coating, roll coating, and spray coating may be applied.

In the case of performing inkjet application, a method of ejecting by an inkjet method using an inkjet head may be applied. Suitable examples of the inkjet head include the heads used in a charge control system that ejects ink by utilizing an electrostatic attraction force; a drop on demand system that utilizes the vibration pressure of a piezoelectric element (pressure pulse system); an acoustic ink-jet system that converts electric signals into acoustic beams, irradiates ink with the beams, and ejects the ink by utilizing a radiation pressure; and a thermal ink-jet (BUBBLEJET (registered trademark)) system that heats ink to form bubbles and utilizes the pressure resulting therefrom.

In the case of performing printing, a screen printing method may be applied.

In the case of performing deposition, atomization based on spraying, deposition based on vaporization, dipping, and the like may be mentioned. Among them, deposition based on vaporization is preferable, and in that case, it is preferable to perform the treatment under reduced pressure for about 30 to 600 seconds.

In the case of performing coating or inkjet application, a solution prepared using an adhesion aid is used. For this solution, for example, a solution prepared by mixing and dissolving a desired adhesion aid in a solvent such as cyclohexanone, may be used.

After such an adhesion aid is applied, it is preferable to dry the adhesion aid using a hot plate, an oven or the like, at 50 to 300° C. for about 30 to 600 seconds.

As the adhesion aid used in the invention, silicon nitride, silicon oxide and the like may be used, in view of the adhesiveness to cured areas (image), which works with the curable layer (particularly alkoxysilane compound) that will be described below, and the developability of uncured areas. Among them, a compound represented by the following formula (A) is preferable from the viewpoint of forming a colored pattern having excellent adhesiveness to an inorganic substrate surface, without worsening the problem of development residues on uncured areas (unexposed areas). However, the invention is not intended to be limited to this.

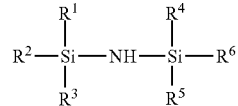

Formula (A)

In the formula (A), $R^1$ to $R^6$ each independently represent a hydrocarbon group having 1 to 4 carbon atoms, and may have a cyclic structure and/or an unsaturated bond in the structure. Examples of the hydrocarbon group having 1 to 4 carbon atoms include a methyl group, an ethyl group, a propyl group, and a butyl group. Among others, it is preferable that $R^1$ to $R^6$ be all methyl groups.

Specific examples of the compound represented by the formula (A) are listed below. However, the invention is not intended to be limited to these.

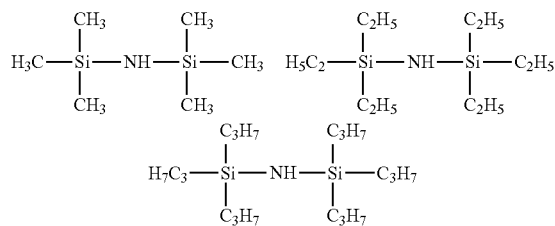

In regard to the amount of presence of the adhesion aid on the inorganic base material, the contact angle of water on the inorganic base material that has been treated with the adhesion aid is preferably 50° or greater, and more preferably 60° or greater. When the amount of presence is in the range mentioned above, the adhesiveness of the colored pattern that constitutes the color filter may be effectively enhanced, while the development residues of the curable layer described below, in the unexposed region which should be essentially removed by development, is reduced.

The term inorganic base material as used in the invention encompasses the inorganic base materials (including substrates, sheets, films and the like) themselves, as well as any base materials (may be organic base materials or inorganic base materials) having an inorganic film formed on the surface.

More preferable examples of the inorganic base material include photoelectric conversion device substrates used in solid-state imaging devices and the like, for example, silicon substrates (particularly, inorganic substrates such as SiN, $SiO_2$ and SiON substrates), and complementary metal oxide semiconductors (CMOS). These substrates may also have formed thereon black stripes that isolate each of the pixels.

Among others, it is particularly preferable when an inorganic substrate has been treated with the compound represented by the formula (A).

<<Solid-State Imaging Device>>

The solid-state imaging device of the invention is constituted to include the color filter of the invention.

Since the solid-state imaging device of the invention is equipped with the color filter of the invention which is excellent in adhesiveness and has suppressed generation of development residues, the solid-state imaging device has less noise and has excellent color reproducibility.

The constitution of the solid-state imaging device of the invention is not particularly limited as long as it is a constitution capable of including the color filter of the invention and capable of functioning as a solid-state imaging device, but for example, there may be mentioned a constitution such as described below.

It is a constitution which has, on a support, plural photodiodes that constitute a light-receiving area of the solid-state imaging device (such as a CCD image sensor or a CMOS image sensor) and transport electrodes formed from polysilicon or the like; a light-shielding film formed from tungsten or the like, having openings only for the light-receiving sections of the photodiodes, over the photodiodes and the transport electrodes; a device protecting film formed from silicon nitride or the like, on the light-shielding film so as to cover the entire area of the light-shielding film and the light-receiving sections of the photodiodes; and the color filter of the invention on the device protecting film.

Furthermore, a constitution having a light collecting unit (for example, a microlens; hereinafter, the same) over the device protecting film and under the color filter (the side close to the support), or a constitution having a light collecting unit on the color filter, is also acceptable.

EXAMPLES

Hereinafter, the invention will be described more specifically by way of Examples, but the invention is not intended to be limited to the following Examples as long as the gist is maintained. In addition, unless particularly stated otherwise, the "part" is on a mass basis.

In the following Examples, the i-line transmittance was obtained by forming a coating film having a thickness of 0.7 μm by applying the curable composition on plain glass and prebaking the assembly, and making a measurement for the coating film using MCPD-3000 (trade name, manufactured by Otsuka Electronics Co., Ltd.)

Example 1

1. Preparation of Curable Composition
(1-1) Preparation of Pigment Dispersion Liquid A mixed liquid obtained by mixing 15 parts of a mixture prepared by mixing C.I. Pigment Green 36, C.I. Pigment Green 7 and C.I. Pigment Yellow 139 at a ratio of 80/20/35 (mass ratio) as a pigment, 10 parts (about 4.5 parts in terms of solids content) of BYK2001 (trade name: DISPERBYK, manufactured by BYK Chemie GmbH; solids concentration 45.0%) as a dispersant, 5.5 parts of methyl methacrylate/methacrylic acid/2-hydroxy-4-acryloyloxymethyl-cyclohexyl methacrylate copolymer (copolymerization ratio (molar ratio)=60/8/32, weight average molecular weight 14000; resin (E-1) shown below) [(E) alkali-soluble resin having ethylenically unsaturated double bonds], and 69.5 parts of cyclohexanone as a solvent, was mixed and dispersed using a bead mill for 15 hours, and thus a pigment dispersion liquid (P1) was prepared.

For the pigment dispersion liquid (P1), the average particle size of the pigment was measured by a dynamic light scattering method using a MICROTRAC NANOTRAC UPA-EX150 (trade name, manufactured by Nikkiso Co., Ltd.), and the average particle size was 200 nm.

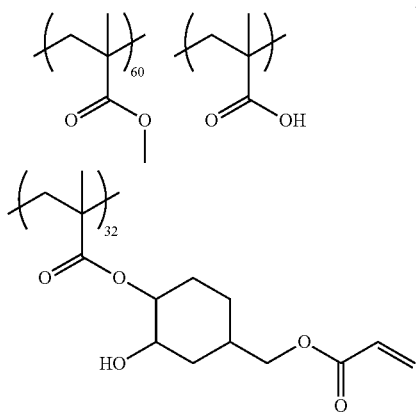

Resin (E-1)

(1-2) Preparation of Curable Composition (Coating Liquid)

The pigment dispersion liquid P1 was used, and the various components in the following composition were mixed therewith and stirred. Thus, a solution of the curable composition P1 was prepared.

<Composition>

| | |
|---|---|
| Pigment dispersion liquid (P1) | 65 parts |
| Compound (A-1) shown below [(A) polymerizable compound having an alkyleneoxy group having two or more carbon atoms] | 3.3 parts |
| Dipentaerythritol hexaacrylate (DPHA) [(B) polymerizable compound lacking an alkyleneoxy group having two or more carbon atoms] | 0.8 parts |
| Compound (C-1) shown below [(C) i-line absorber having a diethylamine structure] | 0.9 parts |
| CGI-242 [oxime-based photopolymerization initiator manufactured by Ciba Specialty Chemicals, Inc. (the structure is shown below); (D) photopolymerization initiator] | 0.9 parts |
| Compound (G-1) shown below [amino group-containing (G) alkoxysilane compound] | 1.3 parts |
| Surfactant (trade name: MEGAFAC F-781-F) | 0.1 parts |
| Polymerization inhibitor (p-methoxyphenol) | 0.1 parts |
| Cyclohexanone | 2.5 parts |
| Propylene glycol monomethyl ether acetate (PGMEA; solvent) | 9.0 parts |

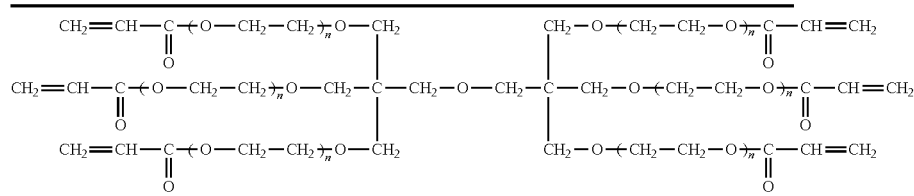

Sum of respective n's is 12

Compound (A-1)

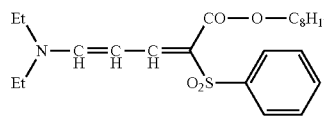

Compound (C-1)

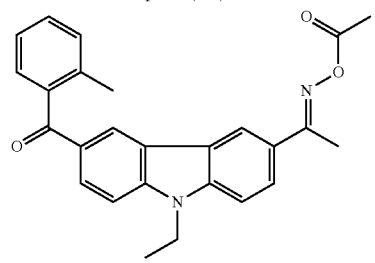

CGI-242

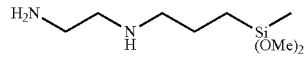

Compound (G-1)

Here, in regard to the viscosity stability over time of the solution of curable composition P1, the viscosities before storage (initial), after storage for one month at room temperature, and after storage for 3 days at 45° C. were respectively measured using an E type viscometer (manufactured by Toki Sangyo Co., Ltd.), and the viscosity stability was evaluated according to the following determination criteria. The evaluation results are presented in the following Table 1.

<Determination Criteria>

A: Viscosity increase was not recognized.

B: A variation in viscosity of less than 5% was recognized.

C: A variation in viscosity of equal to or more than 5% and less than 10% was recognized.

D: A variation in viscosity of 10% or more was recognized.

2. Production of Color Filter (2-1) Formation of Curable Layer

A curable layer was formed directly on a Si substrate (that is, without an organic undercoat film disposed therebetween) as follows, without providing an organic undercoat film.

Specifically, first, a Si substrate was provided, and HMDS (trade name, manufactured by Fujifilm Electronics Materials, Inc.; hexamethyldisilazane) was vapor deposited on the surface of this Si substrate, using a low pressure adhesion treatment apparatus LPAH (mounted in coating apparatus for spin coating, SK-60BW) (trade name, manufactured by Dainippon Screen Manufacturing Co., Ltd.) under the following conditions. At this time, the contact angle of water on the Si substrate as measured with DROP MASTER 500 (trade name, manufactured by Kyowa Interface Science Co., Ltd.) was 62°.

Thereafter, the solution of curable composition P1 was spin coated on the side of the Si substrate where HMDS had been deposited, using a coating apparatus for spin coating (trade name: SK-60BW, manufactured by Dainippon Screen Manufacturing Co., Ltd.) under the following conditions. Subsequently, the coated substrate was subjected to prebaking at 100° C. for 120 seconds, and thereby a curable layer was formed.

<Conditions for HMDS Vapor Deposition>

| | |
|---|---|
| Substrate temperature | 110° C. |
| Deposition time | 45 seconds |

<Conditions for Spin Coating of Curable Composition P1>

| Amount of dropwise addition | 2 g |
|---|---|
| Rate of coating | 1000 r.p.m. |
| Coating thickness (dry thickness) | 1.0 μm |
| Coating temperature | 23° C. |

(2-2) Exposure and Development

The curable layer formed as described above was exposed using an i-line exposure apparatus (trade name: FPA-3000i5, manufactured by Canon, Inc.) in the case of high illuminance exposure (1000 mW/cm$^2$), and using an i-line exposure apparatus (trade name: NSR2005i9, manufactured by Nikon Corp.) in the case of low illuminance exposure (500 mW/cm$^2$), and using photomasks for Bayer pattern test with line width 1.2 μm/line width 1.7 μm/line width 2.0 μm/line width 2.2 μm. After the exposure, the entire surface of the curable layer was covered with a 60% aqueous solution of an organic developer liquid (trade name: CD2000, manufactured by Fujifilm Electronics Materials, Inc.), and was left to stand for 60 seconds. In this manner, a colored pattern was formed on the Si substrate.

The mask pattern of the photomask for Bayer pattern test is a mask pattern in which a pattern formed by plural squares arranged in a checkered pattern (Bayer pattern) is provided for each line width.

(2-3) Rinsing Treatment

After being left to stand, pure water was sprayed in a straight pattern to wash away the developer liquid, and the curable layer (colored pattern) obtained after exposure and development treatments had been applied was heated on a hot plate at 220° C. for 5 minutes (post-baking) Thus, a color filter of monochromatic green color was formed on the Si substrate.

3. Performance Evaluation

In regard to the curable layer and the color filter described above, the resolving power, development residues, and the adhesiveness of the colored pattern to the substrate were evaluated as follows. The evaluation results are presented in the following Table 1.

In addition, the results of Example 1 are presented in Table 2 to Table 5 in addition to Table 1, for a comparison with other Examples.

(1) Resolving Power

Exposure was performed by varying the amount of exposure to various amounts of exposure between 50 and 1250 mJ/cm$^2$, and for each of the Bayer pattern having a line width of 2.0 μm and the Bayer pattern having a line width of 1.7 μm, the cross-section shape obtained after post-baking when exposed at an amount of exposure of 100 mJ/cm$^2$, was observed by cross-sectional SEM (trade name: S-4800, manufactured by Hitachi High-Technologies, Corp.). Thus, the taper angle was evaluated.

<Evaluation Criteria>

A: 85° or greater
B: Equal to or greater than 80° and less than 85°
C: Equal to or greater than 75° and less than 80°
D: Less than 75°

(2) Development Residue (Residue of Curable Layer)

Exposure was performed by varying the amount of exposure to various amounts of exposure between 50 and 1250 mJ/cm$^2$, and the residues generated between the patterns after post-baking when exposed at an amount of exposure of 100 mJ/cm$^2$, was observed by dimensional SEM (trade name: S-9260A, manufactured by Hitachi High-Technologies, Corp.). An evaluation was made according to the following evaluation criteria.

<Evaluation Criteria>

A: No residue was confirmed at the unexposed areas.
B: A slight amount of residues was confirmed at the unexposed areas, but to an extent free of problem for actual use.
C: Residues were confirmed at the unexposed areas.
D: A significant amount of residues was confirmed at the unexposed areas.

(3) Adhesiveness to Substrate

For the Bayer patterns with line width 1.2 μm/line width 1.7 μm/line width 2.0 μm/line width 2.2 μm, the presence or absence of the occurrence of pattern loss was observed under a microscope. Thus, the adhesiveness to the substrate after post-baking was evaluated according to the following evaluation criteria.

This evaluation of the adhesiveness to the substrate was carried out for both the case of using the curable composition prior to storage (initial) and the case of using the curable composition after storage for one month at room temperature and subsequent further storage for 3 days at 45° C.

Table 1 to Table 10 show the results for the Bayer patterns with a line width of 1.7 μm or less (that is, a line width of 1.2 μm and a line width of 1.7 μm).

<Evaluation Criteria>

A: No pattern loss was observed.
B: Almost no pattern loss was observed.
C: Slight pattern loss was partially observed.
D: Significant pattern loss was observed.

Examples 2 and 3, Comparative Examples 1 to 4

Curable compositions and color filters were produced in the same manner as in Example 1, except that while the total mass of the component (A) and the component (B) [(A)+(B)] used in the preparation of the curable composition of Example 1 was not changed, the mass ratio [(A)/((A)+(B))] was changed as indicated in Table 1. The same evaluations as in Example 1 were carried out. The evaluation results are presented in Table 1.

TABLE 1

<On inorganic substrate (without organic undercoat film)>

|   |   | Example 1 | Example 2 | Example 3 | Comparative Example 1 |
|---|---|---|---|---|---|
| (A) | Polymerizable compound having alkyleneoxy group | Used | Used | Used | Not used |
| (B) | Polymerizable compound lacking alkyleneoxy group | Used | Used | Used | Used |
| (C) | i-line absorber having diethylamine structure | Used | Used | Used | Used |
|   | i-line absorber lacking diethylamine structure | — | — | — | — |
| (D) | Photopolymerization initiator | Used | Used | Used | Used |
| (E) | Alkali-soluble resin having ethylenic double bond | Used | Used | Used | Used |
|   | Alkali-soluble resin lacking ethylenic double bond | — | — | — | — |

TABLE 1-continued

<On inorganic substrate (without organic undercoat film)>

| (G) | Alkoxysilane compound having amino group | | | Used | Used | Used | Used |
|---|---|---|---|---|---|---|---|
| | Alkoxysilane compound lacking amino group | | | — | — | — | — |
| | Amount of addition (based on total solids content) | | | 5% | 5% | 5% | 5% |
| Mass ratio (A)/((A) + (B)) | | | | 0.70 | 0.90 | 0.50 | 0.00 |
| i-line transmittance | | | | 5% | 5% | 5% | 5% |

| | | | | Low illumi- nance | High illumi- nance | Low illumi- nance | High illumi- nance | Low illumi- nance | High illumi- nance | Low illumi- nance | High illumi- nance |
|---|---|---|---|---|---|---|---|---|---|---|---|
| Characteristics | Processing characteristics | Resolving power | 2.0 μm | A | A | A | A | A | A | A | A |
| | | | 1.7 μm | A | A | A | A | B | B | D | D |
| | | Adhesiveness for 1.7 μm or less | Initial | A | A | B | B | A | A | A | A |
| | | | After time lapse (45° C., 3 days) | A | A | B | B | A | A | A | A |
| | | Development residues | | A | A | A | A | B | B | D | D |
| | Agent liquid characteristics | Viscosity stability over time | | A | | A | | A | | A | |

| | | | | Comparative Example 2 | Comparative Example 3 | Comparative Example 4 |
|---|---|---|---|---|---|---|
| (A) | Polymerizable compound having alkyleneoxy group | | | Used | Used | Used |
| (B) | Polymerizable compound lacking alkyleneoxy group | | | Used | Used | Not used |
| (C) | i-line absorber having diethylamine structure | | | Used | Used | Used |
| | i-line absorber lacking diethylamine structure | | | — | — | — |
| (D) | Photopolymerization initiator | | | Used | Used | Used |
| (E) | Alkali-soluble resin having ethylenic double bond | | | Used | Used | Used |
| | Alkali-soluble resin lacking ethylenic double bond | | | — | — | — |
| (G) | Alkoxysilane compound having amino group | | | Used | Used | Used |
| | Alkoxysilane compound lacking amino group | | | — | — | — |
| | Amount of addition (based on total solids content) | | | 5% | 5% | 5% |
| Mass ratio (A)/((A) + (B)) | | | | 0.95 | 0.45 | 1.00 |
| i-line transmittance | | | | 5% | 5% | 5% |

| | | | | Low illumi- nance | High illumi- nance | Low illumi- nance | High illumi- nance | Low illumi- nance | High illumi- nance |
|---|---|---|---|---|---|---|---|---|---|
| Characteristics | Processing characteristics | Resolving power | 2.0 μm | A | A | A | A | A | A |
| | | | 1.7 μm | A | A | D | D | A | A |
| | | Adhesiveness for 1.7 μm or less | Initial | D | D | A | A | D | D |
| | | | After time lapse (45° C., 3 days) | D | D | A | A | D | D |
| | | Development residues | | A | A | D | D | A | A |
| | Agent liquid characteristics | Viscosity stability over time | | A | | A | | A | |

As shown in Table 1, in Example 1 to Example 3 where the mass ratio [(A)/((A)+(B))] was from 0.5 to 0.9, adhesiveness was satisfactory, and development residues were reduced. Furthermore, the viscosity stability over time and the resolving power were also satisfactory.

On the contrary, in Comparative Example 1 and Comparative Example 3 where the mass ratio [(A)/((A)+(B))] was less than 0.5, the problem of development residues and the resolving power became worse. In addition, in Comparative Example 2 and Comparative Example 4 where the ratio [(A)/((A)+(B))] exceeded 0.9, adhesiveness deteriorated.

Example 4, Comparative Example 5

Curable compositions and color filters were produced in the same manner as in Example 1, except that the i-line transmittance was changed as indicated in Table 2 by changing the content of the (C) i-line absorber used in the preparation of the curable composition in Example 1. The same evaluations as in Example 1 were carried out. The evaluation results are presented in Table 2.

Example 5

A curable composition and a color filter were produced in the same manner as in Example 1, except that the compound (C-1) [ultraviolet absorber having a diethylamine structure] used in the preparation of the curable composition in Example 1 was changed to the same mass of a compound (C-2) shown below [ultraviolet absorber lacking a diethylamine structure]. The same evaluations as in Example 1 were carried out. The evaluation results are presented in Table 2.

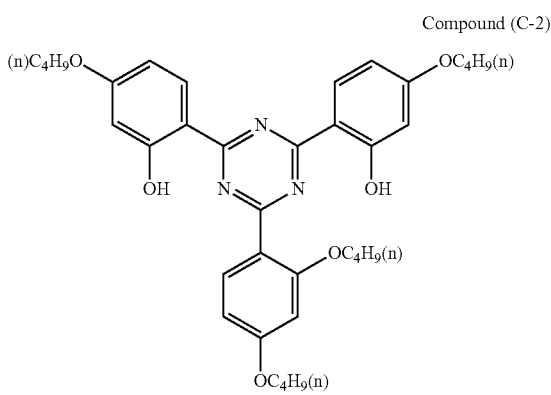

Compound (C-2)

TABLE 2

<On inorganic substrate (without organic undercoat film)>

|  |  | Example 1 | Example 4 | Comparative Example 5 | Example 5 |
|---|---|---|---|---|---|
| (A) | Polymerizable compound having alkyleneoxy group | Used | Used | Used | Used |
| (B) | Polymerizable compound lacking alkyleneoxy group | Used | Used | Used | Used |
| (C) | i-line absorber having diethylamine structure | Used | Used | Not used | — |
|  | i-line absorber lacking diethylamine structure | — | — | — | Used |
| (D) | Photopolymerization initiator | Used | Used | Used | Used |
| (E) | Alkali-soluble resin having ethylenic double bond | Used | Used | Used | Used |
|  | Alkali-soluble resin lacking ethylenic double bond | — | — | — | — |
| (G) | Alkoxysilane compound having amino group | Used | Used | Used | Used |
|  | Alkoxysilane compound lacking amino group | — | — | — | — |
|  | Amount of addition (based on total solids content) | 5% | 5% | 5% | 5% |
| Mass ratio (A)/((A) + (B)) |  | 0.70 | 0.70 | 0.70 | 0.70 |
| i-line transmittance |  | 5% | 10% | 15% | 5% |

|  |  |  |  | Low illuminance | High illuminance | Low illuminance | High illuminance | Low illuminance | High illuminance | Low illuminance | High illuminance |
|---|---|---|---|---|---|---|---|---|---|---|---|
| Characteristics | Processing characteristics | Resolving power | 2.0 μm | A | A | A | B | B | D | A | A |
|  |  |  | 1.7 μm | A | A | A | B | B | D | A | A |
|  |  | Adhesiveness for 1.7 μm or less | Initial | A | A | A | A | A | A | A | A |
|  |  |  | After time lapse (45° C., 3 days) | A | A | A | A | A | A | A | A |
|  |  | Development residues |  | A | A | A | B | C | D | C | C |
|  | Agent liquid characteristics | Viscosity stability over time |  | A |  | A |  | A |  | C |  |

As shown in Table 2, in Example 1, Example 4 and Example 5 where the i-line transmittance was 10% or less, adhesiveness was satisfactory.

On the contrary, in Comparative Example 5 where the i-line transmittance exceeded 10%, the resolving power and the problem of development residues became worse.

Example 6

A curable composition and a color filter were produced in the same manner as in Example 1, except that the (E) alkali-soluble resin having an ethylenically unsaturated bond used in the preparation of the curable composition in Example 1 was changed to the same mass of (E) an alkali-soluble resin lacking an ethylenically unsaturated bond (resin E-2 shown below; benzyl methacrylate/methacrylic acid copolymer (co-polymerization ratio (molar ratio)=70/30, weight average molecular weight 30000)). The same evaluations as in Example 1 were carried out. The evaluation results are presented in Table 3.

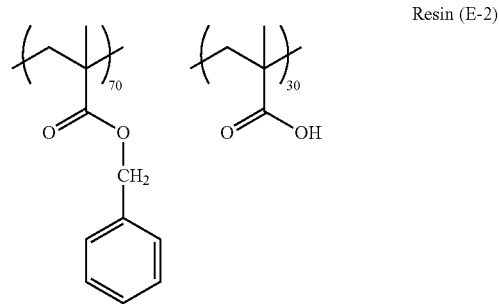

Resin (E-2)

TABLE 3

<On inorganic substrate (without organic undercoat film)>

|  |  | Example 1 | Example 6 |
|---|---|---|---|
| (A) | Polymerizable compound having alkyleneoxy group | Used | Used |
| (B) | Polymerizable compound lacking alkyleneoxy group | Used | Used |
| (C) | i-line absorber having diethylamine structure | Used | Used |
|  | i-line absorber lacking diethylamine structure | — | — |
| (D) | Photopolymerization initiator | Used | Used |
| (E) | Alkali-soluble resin having ethylenic double bond | Used | — |
|  | Alkali-soluble resin lacking ethylenic double bond | — | Used |
| (G) | Alkoxysilane compound having amino group | Used | Used |
|  | Alkoxysilane compound lacking amino group | — | — |
|  | Amount of addition (based on total solids content) | 5% | 5% |
| Mass ratio (A)/((A) + (B)) |  | 0.7 | 0.7 |
| i-line transmittance |  | 5% | 5% |

TABLE 3-continued

<On inorganic substrate (without organic undercoat film)>

| | | | | Example 1 | | Example 6 | |
|---|---|---|---|---|---|---|---|
| | | | | Low illuminance | High illuminance | Low illuminance | High illuminance |
| Characteristics | Processing characteristics | Resolving power | 2.0 μm | A | A | A | A |
| | | | 1.7 μm | A | A | A | A |
| | | Adhesiveness for 1.7 μm or less | Initial | A | A | C | C |
| | | | After time lapse (45° C., 3 days) | A | A | C | C |
| | | Development residues | | A | A | A | A |
| | Agent liquid characteristics | Viscosity stability over time | | A | | A | |

As shown in Table 3, in a comparison between Example 6 using (E) an alkali-soluble resin lacking an ethylenically unsaturated bond and Example 1 using (E) an alkali-soluble resin having an ethylenically unsaturated bond, Example 1 had excellent adhesiveness.

Example 7 to Example 11

Curable compositions and color filters were produced in the same manner as in Example 1, except that the mass of the (G) alkoxysilane compound used in the preparation of the curable composition in Example 1 was changed. The same evaluations as in Example 1 were carried out. The evaluation results are presented in Table 4.

Example 12

A curable composition and a color filter were produced in the same manner as in Example 1, except that the (G) alkoxysilane compound used in the preparation of the curable composition in Example 1 was changed to methyltrimethoxysilane [alkoxysilane compound lacking an amino group]. The same evaluations as in Example 1 were carried out. The evaluation results are presented in Table 4.

TABLE 4

<On inorganic substrate (without organic undercoat film)>

| | | | Example 1 | Example 7 | Example 8 | Example 9 |
|---|---|---|---|---|---|---|
| (A) | Polymerizable compound having alkyleneoxy group | | Used | Used | Used | Used |
| (B) | Polymerizable compound lacking alkyleneoxy group | | Used | Used | Used | Used |
| (C) | i-line absorber having diethylamine structure | | Used | Used | Used | Used |
| | i-line absorber lacking diethylamine structure | | — | — | — | — |
| (D) | Photopolymerization initiator | | Used | Used | Used | Used |
| (E) | Alkali-soluble resin having ethylenic double bond | | Used | Used | Used | Used |
| | Alkali-soluble resin lacking ethylenic double bond | | — | — | — | — |
| (G) | Alkoxysilane compound having amino group | | Used | Used | Used | Not used |
| | Alkoxysilane compound lacking amino group | | — | — | — | — |
| | Amount of addition (based on total solids content) | | 5% | 10% | 0.1% | 0% |
| Mass ratio (A)/((A) + (B)) | | | 0.7 | 0.7 | 0.7 | 0.7 |
| i-line transmittance | | | 5% | 5% | 5% | 5% |

| | | | | Example 1 | | Example 7 | | Example 8 | | Example 9 | |
|---|---|---|---|---|---|---|---|---|---|---|---|
| | | | | Low illuminance | High illuminance | Low illuminance | High illuminance | Low illuminance | High illuminance | Low illuminance | High illuminance |
| Characteristics | Processing characteristics | Resolving power | 2.0 μm | A | A | A | A | A | A | A | A |
| | | | 1.7 μm | A | A | A | A | A | A | A | A |
| | | Adhesiveness for 1.7 μm or less | Initial | A | A | A | A | B | B | C | C |
| | | | After time lapse (45° C., 3 days) | A | A | A | A | B | B | C | C |
| | | Development residues | | A | A | B | B | A | A | A | A |
| | Agent liquid characteristics | Viscosity stability over time | | A | | B | | A | | A | |

| | | | Example 10 | Example 11 | Example 12 |
|---|---|---|---|---|---|
| (A) | Polymerizable compound having alkyleneoxy group | | Used | Used | Used |
| (B) | Polymerizable compound lacking alkyleneoxy group | | Used | Used | Used |
| (C) | i-line absorber having diethylamine structure | | Used | Used | Used |
| | i-line absorber lacking diethylamine structure | | — | — | — |
| (D) | Photopolymerization initiator | | Used | Used | Used |
| (E) | Alkali-soluble resin having ethylenic double bond | | Used | Used | Used |
| | Alkali-soluble resin lacking ethylenic double bond | | — | — | — |

TABLE 4-continued

<On inorganic substrate (without organic undercoat film)>

| (G) | Alkoxysilane compound having amino group | Used | Used | — |
|---|---|---|---|---|
| | Alkoxysilane compound lacking amino group | — | — | Used |
| | Amount of addition (based on total solids content) | 15% | 0.05% | 5% |
| Mass ratio (A)/((A) + (B)) | | 0.7 | 0.7 | 0.7 |
| i-line transmittance | | 5% | 5% | 5% |

| | | | | Low illumi-nance | High illumi-nance | Low illumi-nance | High illumi-nance | Low illumi-nance | High illumi-nance |
|---|---|---|---|---|---|---|---|---|---|
| Characteristics | Processing characteristics | Resolving power | 2.0 μm | A | A | A | A | A | A |
| | | | 1.7 μm | A | A | A | A | A | A |
| | | Adhesiveness for 1.7 μm or less | Initial | A | A | C | C | C | C |
| | | | After time lapse (45° C., 3 days) | A | A | C | C | C | C |
| | | Development residues | | C | C | A | A | C | C |
| | Agent liquid characteristics | Viscosity stability over time | | C | | A | | A | |

As shown in Table 4, among Example 1, and Example 7 to Example 12, in Example 1, Example 7 and Example 8 where (G) an alkoxysilane compound having a diethylamine structure was used and the content of the (G) alkoxysilane compound was from 0.1% by mass to 10% by mass, adhesiveness was especially excellent, and development residues were suppressed in particular.

Example 13 to Example 16

Curable compositions and color filters were produced in the same manner as in Example 1, except that the types of the (C) i-line absorber and the (G) alkoxysilane compound used in the preparation of the curable composition in Example 1 were changed as indicated in Table 5. The same evaluations as in Example 1 were carried out. The evaluation results are presented in Table 5.

TABLE 5

<On inorganic substrate (without organic undercoat film)>

| | | Example 1 | Example 13 | Example 14 |
|---|---|---|---|---|
| (A) | Polymerizable compound having alkyleneoxy group | A-1 | A-1 | A-1 |
| (B) | Polymerizable compound lacking alkyleneoxy group | DPHA | DPHA | DPHA |
| (C) | i-line absorber having diethylamine structure | C-1 | C-3 | C-1 |
| | i-line absorber lacking diethylamine structure | — | — | — |
| (D) | Photopolymerization initiator | CGI-242 | CGI-242 | CGI-242 |
| (E) | Alkali-soluble resin having ethylenic double bond | E-1 | E-1 | E-1 |
| | Alkali-soluble resin lacking ethylenic double bond | — | — | — |
| (G) | Alkoxysilane compound having amino group | G-1 | G-1 | G-2 |
| | Alkoxysilane compound lacking amino group | — | — | — |
| | Amount of addition (based on total solids content) | 5% | 5% | 5% |
| Mass ratio (A)/((A) + (B)) | | 0.7 | 0.7 | 0.7 |
| i-line transmittance | | 5% | 5% | 5% |

| | | | | Low illumi-nance | High illumi-nance | Low illumi-nance | High illumi-nance | Low illumi-nance | High illumi-nance |
|---|---|---|---|---|---|---|---|---|---|
| Characteristics | Processing characteristics | Resolving power | 2.0 μm | A | A | A | A | A | A |
| | | | 1.7 μm | A | A | A | A | A | A |
| | | Adhesiveness for 1.7 μm or less | Initial | A | A | A | A | A | A |
| | | | After time lapse (45° C., 3 days) | A | A | A | A | A | A |
| | | Development residues | | A | A | A | A | A | A |
| | Agent liquid characteristics | Viscosity stability over time | | A | | A | | A | |

| | | Example 15 | Example 16 |
|---|---|---|---|
| (A) | Polymerizable compound having alkyleneoxy group | A-1 | A-1 |
| (B) | Polymerizable compound lacking alkyleneoxy group | DPHA | DPHA |
| (C) | i-line absorber having diethylamine structure | C-1 | C-1 |
| | i-line absorber lacking diethylamine structure | — | — |
| (D) | Photopolymerization initiator | CGI-242 | CGI-242 |
| (E) | Alkali-soluble resin having ethylenic double bond | E-1 | E-1 |
| | Alkali-soluble resin lacking ethylenic double bond | — | — |

TABLE 5-continued

| | | | | <On inorganic substrate (without organic undercoat film)> | | | |
|---|---|---|---|---|---|---|---|
| (G) | Alkoxysilane compound having amino group | | | G-3 | | G-4 | |
| | Alkoxysilane compound lacking amino group | | | — | | — | |
| | Amount of addition (based on total solids content) | | | 5% | | 5% | |
| Mass ratio (A)/((A) + (B)) | | | | 0.7 | | 0.7 | |
| i-line transmittance | | | | 5% | | 5% | |
| | | | | Low illumi-nance | High illumi-nance | Low illumi-nance | High illumi-nance |
| Characteristics | Processing characteristics | Resolving power | 2.0 μm | A | A | A | A |
| | | | 1.7 μm | A | A | A | A |
| | | Adhesiveness for 1.7 μm or less | Initial | A | A | A | A |
| | | | After time lapse (45° C., 3 days) | A | A | A | A |
| | | Development residues | | A | A | A | A |
| | Agent liquid characteristics | Viscosity stability over time | | A | | A | |

—Explanation of Reference Symbols in Table 5—
"A-1", "C-1", "E-1" and "G-1" respectively represent the compound (A-1), compound (C-1), compound (E-1) and compound (G-1).
"C-3", "G-2", "G-3" and "G-4" respectively represent the compound (C-3), compound (G-2), compound (G-3) and compound (G-4) described below.

• Compound (C-3)

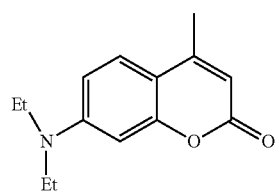

• Compound (G-2)

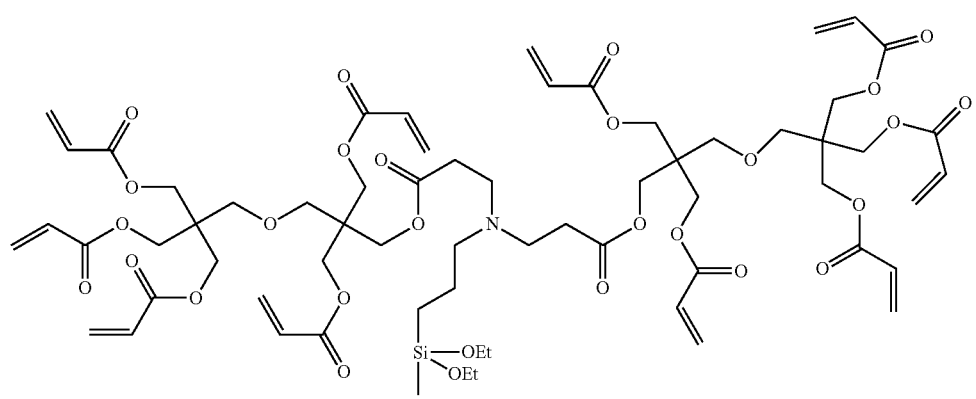

-continued

• Compound (G-3)

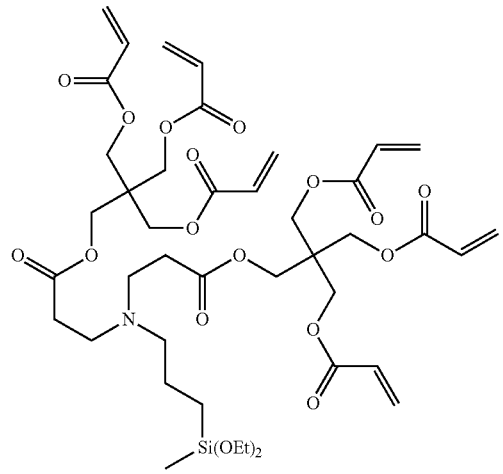

• Compound (G-4)

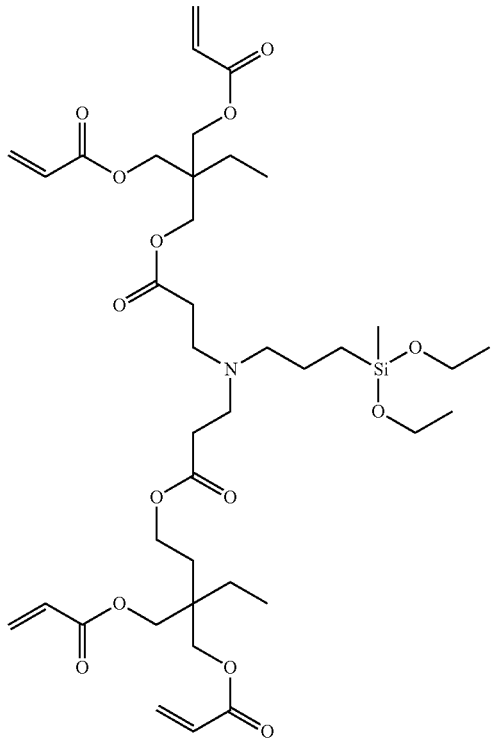

As shown in Table 5, also in Example 13 to Example 16 where the types of the compounds were changed variously, adhesiveness was satisfactory and development residues were reduced, similarly to Example 1. Furthermore, the viscosity stability over time and the resolving power were also satisfactory.

In addition, for each of Example 13 to Example 16, the mass ratio [(A)/((A)+(B))], the i-line transmittance, the type of the alkali-soluble resin, and the content and type of the alkoxysilane compound were varied, and evaluations were carried out. These Examples exhibited the same behavior as observed in Example 1.

Example 101 to Example 116, Comparative Example 101 to Comparative Example 105

Color filters were produced in the same manners as in Example 1 to Example 16 and Comparative Example 1 to Comparative Example 5, except that the formation of the curable layer such as carried out in Example 1 to Example 16 and Comparative Example 1 to Comparative Example 5 was changed as shown below. The same evaluations as in Example 1 were carried out.

That is, in Example 101 to Example 116 and Comparative Example 101 to Comparative Example 105, the curable layer was formed on a Si substrate, with an organic undercoat film disposed therebetween.

—Formation of Curable Layer—

A Si substrate was prepared, and on this Si substrate, a resist for forming organic films (trade name: CT4000L, manufactured by Fujifilm Electronics Materials, Inc.) was spin coated using a coating apparatus for spin coating (trade name: SK-60BW, manufactured by Dainippon Screen Manufacturing Co., Ltd.) under the following conditions. Subsequently, the assembly was subjected to a heat curing treatment at 220° C./5 min, and thus an organic undercoat film was formed on the Si substrate.

Subsequently, a solution of the curable composition P1 was spin coated on the side of the Si substrate where an organic undercoat film had been formed, using a coating apparatus for spin coating (trade name: SK-60BW, manufactured by Dainippon Screen Manufacturing Co., Ltd.) under the following conditions, and the assembly was subjected to prebaking at 100° C. for 120 seconds. Thus, a curable layer was formed.

<Conditions for Spin Coating of Organic Undercoat Film>

| | |
|---|---|
| Amount of dropwise addition | 2 g |
| Rate of coating | 1500 r.p.m. |
| Coating thickness (dry thickness) | 0.1 μm |
| Coating temperature | 23° C. |

<Conditions for Spin Coating of Curable Composition P1>

| | |
|---|---|
| Amount of dropwise addition | 2 g |
| Rate of coating | 1000 r.p.m. |
| Coating thickness (dry thickness) | 1.0 μm |
| Coating temperature | 23° C. |

The evaluation results for Example 101 to Example 116 and Comparative Example 101 to Comparative Example 105 are presented in Table 6 to Table 10 shown below.

TABLE 6

<Organic undercoat film present>

|     |     |     |     | Example 101 | | Example 102 | | Example 103 | | Comparative Example 101 | |
| --- | --- | --- | --- | --- | --- | --- | --- | --- | --- | --- | --- |
| (A) | Polymerizable compound having alkyleneoxy group | | | Used | | Used | | Used | | Not used | |
| (B) | Polymerizable compound lacking alkyleneoxy group | | | Used | | Used | | Used | | Used | |
| (C) | i-line absorber having diethylamine structure | | | Used | | Used | | Used | | Used | |
|     | i-line absorber lacking diethylamine structure | | | — | | — | | — | | — | |
| (D) | Photopolymerization initiator | | | Used | | Used | | Used | | Used | |
| (E) | Alkali-soluble resin having ethylenic double bond | | | Used | | Used | | Used | | Used | |
|     | Alkali-soluble resin lacking ethylenic double bond | | | — | | — | | — | | — | |
| (G) | Alkoxysilane compound having amino group | | | Used | | Used | | Used | | Used | |
|     | Alkoxysilane compound lacking amino group | | | — | | — | | — | | — | |
|     | Amount of addition (based on total solids content) | | | 5% | | 5% | | 5% | | 5% | |
| Mass ratio (A)/((A) + (B)) | | | | 0.70 | | 0.90 | | 0.50 | | 0.00 | |
| i-line transmittance | | | | 5% | | 5% | | 5% | | 5% | |
|     |     |     |     | Low illuminance | High illuminance | Low illuminance | High illuminance | Low illuminance | High illuminance | Low illuminance | High illuminance |
| Characteristics | Processing characteristics | Resolving power | 2.0 μm | A | A | A | A | A | A | A | A |
|     |     |     | 1.7 μm | A | A | A | A | B | B | D | D |
|     |     | Adhesiveness for 1.7 μm or less | Initial | A | A | A | A | A | A | A | A |
|     |     |     | After time lapse (45° C., 3 days) | A | A | A | A | A | A | A | A |
|     |     | Development residues | | A | A | A | A | B | B | D | D |
|     | Agent liquid characteristics | Viscosity stability over time | | A | | A | | A | | A | |

|     |     |     |     | Comparative Example 102 | | Comparative Example 103 | | Comparative Example 104 | |
| --- | --- | --- | --- | --- | --- | --- | --- | --- | --- |
| (A) | Polymerizable compound having alkyleneoxy group | | | Used | | Used | | Used | |
| (B) | Polymerizable compound lacking alkyleneoxy group | | | Used | | Used | | Not used | |
| (C) | i-line absorber having diethylamine structure | | | Used | | Used | | Used | |
|     | i-line absorber lacking diethylamine structure | | | — | | — | | — | |
| (D) | Photopolymerization initiator | | | Used | | Used | | Used | |
| (E) | Alkali-soluble resin having ethylenic double bond | | | Used | | Used | | Used | |
|     | Alkali-soluble resin lacking ethylenic double bond | | | — | | — | | — | |
| (G) | Alkoxysilane compound having amino group | | | Used | | Used | | Used | |
|     | Alkoxysilane compound lacking amino group | | | — | | — | | — | |
|     | Amount of addition (based on total solids content) | | | 5% | | 5% | | 5% | |
| Mass ratio (A)/((A) + (B)) | | | | 0.95 | | 0.45 | | 1.00 | |
| i-line transmittance | | | | 5% | | 5% | | 5% | |
|     |     |     |     | Low illuminance | High illuminance | Low illuminance | High illuminance | Low illuminance | High illuminance |
|     | Characteristics | Processing characteristics | Resolving power | 2.0 μm | A | A | A | A | A | A |
|     |     |     | 1.7 μm | A | A | D | D | A | A |
|     |     | Adhesiveness for 1.7 μm or less | Initial | C | C | A | A | D | D |
|     |     |     | After time lapse (45° C., 3 days) | C | C | A | A | D | D |
|     |     | Development residues | | A | A | D | D | A | A |
|     | Agent liquid characteristics | Viscosity stability over time | | A | | A | | A | |

TABLE 7

<Organic undercoat film present>

|     |     | Example 101 | Example 104 | Comparative Example 105 | Example 105 |
| --- | --- | --- | --- | --- | --- |
| (A) | Polymerizable compound having alkyleneoxy group | Used | Used | Used | Used |
| (B) | Polymerizable compound lacking alkyleneoxy group | Used | Used | Used | Used |
| (C) | i-line absorber having diethylamine structure | Used | Used | Not used | — |
|     | i-line absorber lacking diethylamine structure | — | — | — | Used |
| (D) | Photopolymerization initiator | Used | Used | Used | Used |
| (E) | Alkali-soluble resin having ethylenic double bond | Used | Used | Used | Used |
|     | Alkali-soluble resin lacking ethylenic double bond | — | — | — | — |

TABLE 7-continued

<Organic undercoat film present>

|  |  |  | Example 101 | | Example 104 | | Comparative Example 105 | | Example 105 | |
|---|---|---|---|---|---|---|---|---|---|---|
| (G) | Alkoxysilane compound having amino group | | Used | | Used | | Used | | Used | |
|  | Alkoxysilane compound lacking amino group | | — | | — | | — | | — | |
|  | Amount of addition (based on total solids content) | | 5% | | 5% | | 5% | | 5% | |
| Mass ratio (A)/((A) + (B)) | | | 0.70 | | 0.70 | | 0.70 | | 0.70 | |
| i-line transmittance | | | 5% | | 10% | | 15% | | 5% | |
|  |  |  | Low illuminance | High illuminance | Low illuminance | High illuminance | Low illuminance | High illuminance | Low illuminance | High illuminance |
| Characteristics | Processing characteristics | Resolving power 2.0 μm | A | A | A | B | B | D | A | A |
|  |  | 1.7 μm | A | A | A | B | B | D | A | A |
|  | Adhesiveness for 1.7 μm or less | Initial | A | A | A | A | A | A | A | A |
|  |  | After time lapse (45° C., 3 days) | A | A | A | A | A | A | A | A |
|  |  | Development residues | A | A | A | B | C | D | C | C |
|  | Agent liquid characteristics | Viscosity stability over time | A | | A | | A | | C | |

TABLE 8

<Organic undercoat film present>

|  |  | Example 101 | | Example 106 | |
|---|---|---|---|---|---|
| (A) | Polymerizable compound having alkyleneoxy group | Used | | Used | |
| (B) | Polymerizable compound lacking alkyleneoxy group | Used | | Used | |
| (C) | i-line absorber having diethylamine structure | Used | | Used | |
|  | i-line absorber lacking diethylamine structure | — | | — | |
| (D) | Photopolymerization initiator | Used | | Used | |
| (E) | Alkali-soluble resin having ethylenic double bond | Used | | — | |
|  | Alkali-soluble resin lacking ethylenic double bond | — | | Used | |
| (G) | Alkoxysilane compound having amino group | Used | | Used | |
|  | Alkoxysilane compound lacking amino group | — | | — | |
|  | Amount of addition (based on total solids content) | 5% | | 5% | |
| Mass ratio (A)/((A) + (B)) | | 0.7 | | 0.7 | |
| i-line transmittance | | 5% | | 5% | |
|  |  | Low illuminance | High illuminance | Low illuminance | High illuminance |
| Characteristics | Processing characteristics Resolving power 2.0 μm | A | A | A | A |
|  | 1.7 μm | A | A | A | A |
|  | Adhesiveness for 1.7 μm or less Initial | A | A | C | C |
|  | After time lapse (45° C., 3 days) | A | A | C | C |
|  | Development residues | A | A | A | A |
|  | Agent liquid characteristics Viscosity stability over time | A | | A | |

TABLE 9

<Organic undercoat film present>

|  |  | Example 101 | Example 107 | Example 108 | Example 109 |
|---|---|---|---|---|---|
| (A) | Polymerizable compound having alkyleneoxy group | Used | Used | Used | Used |
| (B) | Polymerizable compound lacking alkyleneoxy group | Used | Used | Used | Used |
| (C) | i-line absorber having diethylamine structure | Used | Used | Used | Used |
|  | i-line absorber lacking diethylamine structure | — | — | — | — |
| (D) | Photopolymerization initiator | Used | Used | Used | Used |
| (E) | Alkali-soluble resin having ethylenic double bond | Used | Used | Used | Used |
|  | Alkali-soluble resin lacking ethylenic double bond | — | — | — | — |
| (G) | Alkoxysilane compound having amino group | Used | Used | Used | Not used |
|  | Alkoxysilane compound lacking amino group | — | — | — | — |
|  | Amount of addition (based on total solids content) | 5% | 10% | 0.1% | 0% |
| Mass ratio (A)/((A) + (B)) | | 0.7 | 0.7 | 0.7 | 0.7 |
| i-line transmittance | | 5% | 5% | 5% | 5% |

TABLE 9-continued

<Organic undercoat film present>

| | | | | Low illuminance | High illuminance | Low illuminance | High illuminance | Low illuminance | High illuminance | Low illuminance | High illuminance |
|---|---|---|---|---|---|---|---|---|---|---|---|
| Characteristics | Processing characteristics | Resolving power | 2.0 μm | A | A | A | A | A | A | A | A |
| | | | 1.7 μm | A | A | A | A | A | A | A | A |
| | | Adhesiveness for 1.7 μm or less | Initial | A | A | A | A | A | A | A | A |
| | | | After time lapse (45° C., 3 days) | A | A | A | A | A | A | A | A |
| | | Development residues | | A | A | B | B | A | A | C | C |
| | Agent liquid characteristics | Viscosity stability over time | | A | | B | | A | | A | |

| | | | Example 110 | Example 111 | Example 112 |
|---|---|---|---|---|---|
| (A) | | Polymerizable compound having alkyleneoxy group | Used | Used | Used |
| (B) | | Polymerizable compound lacking alkyleneoxy group | Used | Used | Used |
| (C) | | i-line absorber having diethylamine structure | Used | Used | Used |
| | | i-line absorber lacking diethylamine structure | — | — | — |
| (D) | | Photopolymerization initiator | Used | Used | Used |
| (E) | | Alkali-soluble resin having ethylenic double bond | Used | Used | Used |
| | | Alkali-soluble resin lacking ethylenic double bond | — | — | — |
| (G) | | Alkoxysilane compound having amino group | Used | Used | — |
| | | Alkoxysilane compound lacking amino group | — | — | Used |
| | | Amount of addition (based on total solids content) | 15% | 0.05% | 5% |
| Mass ratio (A)/((A) + (B)) | | | 0.7 | 0.7 | 0.7 |
| i-line transmittance | | | 5% | 5% | 5% |

| | | | | Low illuminance | High illuminance | Low illuminance | High illuminance | Low illuminance | High illuminance |
|---|---|---|---|---|---|---|---|---|---|
| Characteristics | Processing characteristics | Resolving power | 2.0 μm | A | A | A | A | A | A |
| | | | 1.7 μm | A | A | A | A | A | A |
| | | Adhesiveness for 1.7 μm or less | Initial | A | A | A | A | A | A |
| | | | After time lapse (45° C., 3 days) | A | A | A | A | A | A |
| | | Development residues | | C | C | A | A | C | C |
| | Agent liquid characteristics | Viscosity stability over time | | C | | A | | A | |

TABLE 10

<Organic undercoat film present>

| | | Example 101 | Example 113 | Example 114 |
|---|---|---|---|---|
| (A) | Polymerizable compound having alkyleneoxy group | A-1 | A-1 | A-1 |
| (B) | Polymerizable compound lacking alkyleneoxy group | DPHA | DPHA | DPHA |
| (C) | i-line absorber having diethylamine structure | C-1 | C-3 | C-1 |
| | i-line absorber lacking diethylamine structure | — | — | — |
| (D) | Photopolymerization initiator | CGI-242 | CGI-242 | CGI-242 |
| (E) | Alkali-soluble resin having ethylenic double bond | E-1 | E-1 | E-1 |
| | Alkali-soluble resin lacking ethylenic double bond | — | — | — |
| (G) | Alkoxysilane compound having amino group | G-1 | G-1 | G-2 |
| | Alkoxysilane compound lacking amino group | — | — | — |
| | Amount of addition (based on total solids content) | 5% | 5% | 5% |
| Mass ratio (A)/((A) + (B)) | | 0.7 | 0.7 | 0.7 |
| i-line transmittance | | 5% | 5% | 5% |

| | | | | Low illuminance | High illuminance | Low illuminance | High illuminance | Low illuminance | High illuminance |
|---|---|---|---|---|---|---|---|---|---|
| Characteristics | Processing characteristics | Resolving power | 2.0 μm | A | A | A | A | A | A |
| | | | 1.7 μm | A | A | A | A | A | A |
| | | Adhesiveness for 1.7 μm or less | Initial | A | A | A | A | A | A |
| | | | After time lapse (45° C., 3 days) | A | A | A | A | A | A |
| | | Development residues | | A | A | A | A | A | A |
| | Agent liquid characteristics | Viscosity stability over time | | A | | A | | A | |

TABLE 10-continued

<Organic undercoat film present>

|  |  |  | Example 115 | Example 116 |
|---|---|---|---|---|
| (A) | Polymerizable compound having alkyleneoxy group |  | A-1 | A-1 |
| (B) | Polymerizable compound lacking alkyleneoxy group |  | DPHA | DPHA |
| (C) | i-line absorber having diethylamine structure |  | C-1 | C-1 |
|  | i-line absorber lacking diethylamine structure |  | — | — |
| (D) | Photopolymerization initiator |  | CGI-242 | CGI-242 |
| (E) | Alkali-soluble resin having ethylenic double bond |  | E-1 | E-1 |
|  | Alkali-soluble resin lacking ethylenic double bond |  | — | — |
| (G) | Alkoxysilane compound having amino group |  | G-3 | G-4 |
|  | Alkoxysilane compound lacking amino group |  | — | — |
|  | Amount of addition (based on total solids content) |  | 5% | 5% |
| Mass ratio (A)/((A) + (B)) |  |  | 0.7 | 0.7 |
| i-line transmittance |  |  | 5% | 5% |

|  |  |  |  | Low illuminance | High illuminance | Low illuminance | High illuminance |
|---|---|---|---|---|---|---|---|
| Characteristics | Processing characteristics | Resolving power | 2.0 μm | A | A | A | A |
|  |  |  | 1.7 μm | A | A | A | A |
|  |  | Adhesiveness for 1.7 μm or less | Initial | A | A | A | A |
|  |  |  | After time lapse (45° C., 3 days) | A | A | A | A |
|  |  | Development residues |  | A | A | A | A |
|  | Agent liquid characteristics | Viscosity stability over time |  | A |  | A |  |

As shown in Table 6 to Table 10, in Examples 101 to 116 where the color filters were formed on organic undercoat films, adhesiveness was satisfactory and development residues were reduced, similarly to Examples 1 to 16. Furthermore, the viscosity stability over time and the resolving power were also satisfactory.

As discussed above, Examples for the case of using particular compounds were explained, but even in the case of using compounds other than those described above, the same effects as described above may be obtained as long as the constitution of the invention is satisfied.

Furthermore, although color filters of monochromatic green color were produced in the Examples described above, color filters of multiple colors may be produced by repeating the same operations as described above for the number of colors, and in this case as well, the same effects as those obtainable from the color filters of monochromatic green color may be obtained. In addition, although color filters were formed on Si substrates in the above Examples, when the Si substrate is changed to a substrate for solid-state imaging devices having light-receiving devices such as photodiodes formed thereon, a solid-state imaging device having less noise and having excellent color reproducibility may be produced.

The invention claimed is:

1. A curable composition comprising:

(A) a polymerizable compound having an alkyleneoxy group having two or more carbon atoms represented by the following formula (i) and formula (ii):

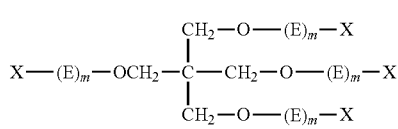

(i)

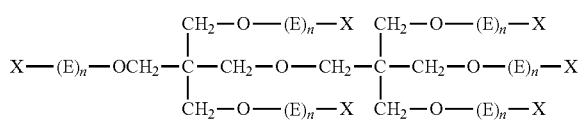

(ii)

wherein each E independently represents —((CH$_2$)$_y$CH$_2$O)— or —((CH$_2$)$_y$CH(CH$_3$)O)—; and each y independently represents an integer from 1 to 10;

each X independently represents an acryloyl group, a methacryloyl group, a hydrogen atom or a carboxyl group;

the sum of acryloyl groups and methacryloyl groups in formula (i) is 3 or 4; and each m independently represents an integer from 0 to 10, while the sum of the respective m's is an integer from 1 to 40;

the sum of acryloyl groups and methacryloyl groups in formula (ii) is 5 or 6; and each n independently represents an integer from 0 to 10, while the sum of the respective n's is an integer from 1 to 60;

(B) a polymerizable compound lacking an alkyleneoxy group having two or more carbon atoms represented by the following formula (iii) or formula (iv):

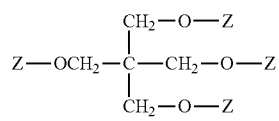

(iii)

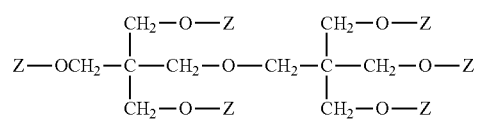

(iv)

wherein each Z independently represents an acryloyl group, a methacryloyl group, a hydrogen atom or a carboxyl group;

the sum of acryloyl groups and methacryloyl groups in formula (iii) is 3 or 4; and the sum of acryloyl groups and methacryloyl groups in formula (iv) is 5 or 6; (C) an i-line absorber represented by the following formula (1):

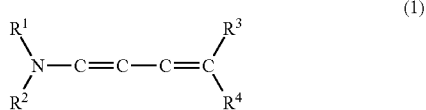

wherein $R^1$ and $R^2$ each independently represents a hydrogen atom, an alkyl group having 1 to 20 carbon atoms, or an aryl group having 6 to 20 carbon atoms; $R^1$ and $R^2$ may be identical to or different from each other, but do not simultaneously represent hydrogen atoms; and $R^3$ and $R^4$ each represents an electron-withdrawing group;

(D) a photopolymerization initiator;

(F) an alkali-soluble resin; and (F) a pigment, wherein the mass ratio [(A)/((A)+(B))] is from 0.6 to 0.9, and the i-line transmittance obtained in a case in which the curable composition is formed into a coating film having a thickness of 0.7 μm, is 10% or less.

2. The curable composition of claim 1, further comprising (G) an alkoxysilane compound, wherein the content of the (G) alkoxysilane compound is from 0.1% by mass to 10.0% by mass relative to total solid content.

3. The curable composition of claim 1, wherein the (C) i-line absorber contains a diethylamine structure.

4. The curable composition of claim 1, wherein the (E) resin contains an ethylenically unsaturated double bond.

5. The curable composition of claim 2, wherein the (G) alkoxysilane compound includes an amino group-containing alkoxysilane compound.

6. A color filter formed by using the curable composition of claim 1.

7. The color filter of claim 6, which is formed directly on an inorganic base material.

8. The color filter of claim 6, comprising a colored Bayer array pattern.

9. A solid-state imaging device comprising the color filter of claim 6.

10. The curable composition of claim 1, wherein the mass ratio [(A)/((A)+(B))] is from 0.6 to 0.8.

11. The curable composition of claim 1, wherein the mass ratio [(A)/((A)+(B))] is from 0.7 to 0.9.

* * * * *